United States Patent
Thornton et al.

(10) Patent No.: US 11,645,044 B2
(45) Date of Patent: May 9, 2023

(54) SYSTEMS AND METHODS FOR MULTI-SOURCE TRUE RANDOM NUMBER GENERATORS, INCLUDING MULTI-SOURCE ENTROPY EXTRACTOR BASED QUANTUM PHOTONIC TRUE RANDOM NUMBER GENERATORS

(71) Applicant: Anametric, Inc., Austin, TX (US)

(72) Inventors: Mitchell A. Thornton, Dallas, TX (US); Duncan L. MacFarlane, Dallas, TX (US); William V. Oxford, Austin, TX (US); Micah A. Thornton, Dallas, TX (US)

(73) Assignee: ANAMETRIC, INC., Austin, TX (US)

( * ) Notice: Subject to any disclaimer, the term of this patent is extended or adjusted under 35 U.S.C. 154(b) by 325 days.

(21) Appl. No.: 16/825,449

(22) Filed: Mar. 20, 2020

(65) Prior Publication Data
US 2020/0301670 A1    Sep. 24, 2020

Related U.S. Application Data

(60) Provisional application No. 62/822,232, filed on Mar. 22, 2019.

(51) Int. Cl.
*H04B 10/70* (2013.01)
*G06F 7/58* (2006.01)
(Continued)

(52) U.S. Cl.
CPC .............. *G06F 7/588* (2013.01); *G06N 10/00* (2019.01); *H01L 31/02027* (2013.01); *H04B 10/70* (2013.01)

(58) Field of Classification Search
CPC ...... H04B 10/70; G06F 7/58; H01L 31/02027; G06N 10/00
See application file for complete search history.

(56) References Cited

U.S. PATENT DOCUMENTS

| 6,609,139 B1 | 8/2003 | Dulz |
| 7,197,523 B2 | 3/2007 | Lutkenhaus |

(Continued)

FOREIGN PATENT DOCUMENTS

| EP | 2000902 A2 | 12/2008 |
| WO | WO 2019006039 | 1/2019 |

OTHER PUBLICATIONS

Arnoldus, H.F. and Nienhuis, G., "Conditions for Sub-Poissonian Photon Statistics and Squeezed States in Resonance Fluorescence," Optica Acta, vol. 30, No. 11, pp. 1573-1585 (1983).

(Continued)

*Primary Examiner* — Dzung D Tran
(74) *Attorney, Agent, or Firm* — Sprinkle IP Law Group

(57) ABSTRACT

Embodiments of systems and methods for a multi-source true random number generator (TRNG) are disclosed. A set of values is generated from each of the sources of randomness and an extractor is applied each of the set of values to produce a set of random values from each source. At least one extractor for at least one of the sources is a multi-radix extractor. The sets of values generated from each source of randomness can be composited to generate a random bitstring as the output of the TRNG.

14 Claims, 8 Drawing Sheets

(51) Int. Cl.
*H01L 31/02* (2006.01)
*G06N 10/00* (2022.01)

(56) References Cited

U.S. PATENT DOCUMENTS

| | | | |
|---|---|---|---|
| 7,389,316 B1 | 6/2008 | Baetoniu | |
| 7,970,809 B2* | 6/2011 | Michaels | G06F 7/584 |
| | | | 708/250 |
| 8,744,075 B2* | 6/2014 | Tanaka | H04L 9/0858 |
| | | | 380/278 |
| 9,471,280 B2* | 10/2016 | Shi | G06F 7/588 |
| 11,294,638 B2* | 4/2022 | Maynard | G06F 7/588 |
| 2015/0199178 A1 | 7/2015 | Shi | |
| 2020/0328886 A1* | 10/2020 | Newton | H04L 9/0858 |

OTHER PUBLICATIONS

Dorrendorf, L., Gutterman, Z., and Pinkas, B., "Cryptanalysis of the random number generator of the Windows operating system," ACM Transactions on Information and System Security 13(1) Article No. 10, (2009), 24 pgs.

Chattopadhyay, E., "Explicit Two-source Extractors and More," Ph.D. dissertation, The University of Texas at Austin, Austin, TX, May 2016, 274 pgs.

Chattopadhyay, E. and Zuckerman, D., "Explicit Two-source Extractors and Resilient Functions," Electronic Collquium on Computational Complexity, Report No. 119 (2015), dated Jul. 24, 2015 (ECCN ISSN 1433-8092), 29 pgs.

Huntoon, N.R., Christensen, M.P., MacFarlane, D.L., Evans, G.A., and Yeh, C.S., "Integrated Photonic Coupler Based on Frustrated Total Internal Reflection," Applied Optics, vol. 47, No. 30, Oct. 2008, pp. 5682-5690 (Optical Society of America).

Hart, J.D., Terashima, Y., Uchida, A., Baumgartner, G.B., Murphy, T.E., and Roy, R., "Recommendations and Illustrations for the Evaluation of Photonic Random Number Generators," APL Photonics 2, 09090, Published Aug. 25, 2017, 23 pgs. at https://doi.org/10.1063/1.5000056.

ID Quantique, "Quantis: Quantum Random Number Generator-QRNG," retrieved from <<http://certesnetworks.com/pdf/alliance-solutions/QNRG-When-Randomness-Can-Not-Be-Left-To-Chance.pdf>> on Nov. 16, 2018, 2 pgs.

Jennewein, T., Achleitner, U., Weihs, G., Weinfurter, H., and Zeilinger, A., "A Fast and Compact Quantum Random Number Generator," Review of Scientific Instruments, 71(4) 1675 (2000).

Koerner, B., "Russians Engineer a Brilliant Slot Machine Cheat And Casinos Have No Fix," Wired Magazine, Feb. 6, 2017, 3 pgs.

Liu, K., Huang, H., Mu, S.X., Lin, H. and MacFarlane, D.L., "Ultra-compact three-port trench-based photonic couplers in ion-exchanged glass waveguides," Optics Communications 309, 2013, pp. 307-312 (published by Elsevier).

Shumow, D., Ferguson, N., "On the Possibility of a Back Door in the NIST SP800-90 Dual EC," retrieved from <<http://rump2007.cr.yp.to/15-shumow.pdf>>, 9 pgs.

Stipcevic, M., "QBG121 Quantum Random Number Generator, Datasheet, v. Mar, 28, 2006," retrieved from <<http://www.irb.hr/users/stipcevi/index.html>> on Jun. 9, 2018, 1 pg.

Sultana, N., Zhou, W, Lafave, Jr. T.P., and Macfarlane, D.L., "HBr-Based Inductively Coupled Plasma Etching of High Aspect Ratio Nanoscale Trenches in InP: Considerations for Photonic Applications," J. Vac. Sci. Technol., B 27(b), Nov./Dec. 2009, pp. 2351-2356.

Thornton, M.A. and Thornton, M.A., "Multiple-valued Random Digit Extraction," 2018 IEEE 48th International Symposium on Multiple-Value Logic, (ISMVL.2018.00036), May 2018, pp. 162-167.

Thornton, M.A., Randomness Properties of Cryptographic Hash Functions, M.S.C.p.E. thesis, Dept. of Computer Science and Engineering, Southern Methodist University, Dec. 2017, 90 pgs.

International Search Report and Written Opinion for International Patent Application No. PCT/US20/023684, dated Jun. 23, 2020, 10 pgs.

Fox, Mark, Quantum Optics An Introduction, Oxford University Press, Oxford, ISBN 13-978-0-19-856673-1, 2006, 397 pgs.

"Quantum Random Number Generator," product datasheet, qutools GmbH, Munich, GE, retrieved on Jun. 9, 2018, from <<http://www.qutools.com/products/quRNG/quRNG datasheet.pdf>>, 2010, 1 pgs.

Zou, X.T. and Mandel, L., "Photon-antibunching and sub-Poissonian Photon Statistics," Physical Review A, vol. 41, No. 1, (Apr. 1989) copyright 1990, pp. 475-476.

Zhou, W., Sultana, N., and MacFarlane, D.L. "HBr-Based Inductively Coupled Plasma Etching of High Aspect Ratio Nanoscale Trenches in GaInAsP/InP," J. Vac. Sci. Technol., B 26, Nov./Dec. 2008, pp. 1896-1902.

International Preliminary Report on Patentability issued for International PCT Application No. PCT/US2020/023684, dated Oct. 7, 2021, 9 pages.

European Search Report for Patent Application 20779885.1 dated Nov. 16, 2022, 9 pgs.

Thornton, Mitchell A. and MacFarlane, Duncan L., Quantum Photonic TRNG with Dual Extractor, Advances in Databases and Information Systems, Springer Int'l Publishing, Feb. 19, 2019, 12 pgs.

\* cited by examiner

SYSTEMS AND METHODS FOR MULTI-SOURCE TRUE RANDOM NUMBER GENERATORS, INCLUDING MULTI-SOURCE ENTROPY EXTRACTOR BASED QUANTUM PHOTONIC TRUE RANDOM NUMBER GENERATORS

RELATED APPLICATIONS

This application claims a benefit of priority under 35 U.S.C. § 119 to U.S. Provisional Patent Application No. 62/822,232 filed Mar. 22, 2019, entitled "Method and System for Constructing a Multi-Source Entropy Extractor-Based Quantum Photonic TRNG", by Mitchell A. Thornton et al., which is hereby fully incorporated by reference in its entirety.

TECHNICAL FIELD

This disclosure relates generally to random number generators. In particular, this disclosure relates to embodiments of multi-source, extractor based, true random number generators. Even more specifically, this discourse relates to embodiments of multi-source, multi-radix extractor based true random number generators, including quantum photonic circuits for implementing such true random number generators.

BACKGROUND

Many computing devices require a continuous supply of random values to support the implementation of various modern cryptographic methods. The lack of such high-quality random number sources in otherwise secure computing systems has been the cause of several well-documented security breaches. Moreover, it is desirable for the generation of these random bit streams to be accomplished at high data rates to support applications such as modern secure high-speed communications. This need is coupled with the added constraint that random values must be of very high quality in terms of their independence and other statistical properties in order to preserve the integrity of, for example, encryption protocols or other computing operations based on such random numbers. Additionally, high-speed and high-quality random number generators should be as inexpensive, rugged, and reliable as possible when the hosting devices are intended to be mass-produced.

Accordingly, there is a need to for systems and methods for such relatively inexpensive high-speed and high-quality random number generators.

SUMMARY

To address these needs, among others, attention is directed to embodiments of systems and methods for a multi-source (e.g., two or more) true random number generator (TRNG). A set of values is generated from each of the sources of randomness and an extractor is applied each of the set of values to produce a set of random values from each source. At least one extractor for at least one of the sources is a multi-radix extractor. The sets of values generated from each source of randomness can be combined in a composite extractor to generate a random bitstring as the output of the TRNG, where each value in a particular set of values is composited with a corresponding value in each of the other set of values to generate the bitstring. The sources of randomness may, in one case, be physically observable occurrences, such the observation of quantum state information, for example as the observation of the state of a photon, or some similar particle that is in a state of superposition. Other sources of randomness, either quantum or classical may be utilized and are fully contemplated herein without loss of generality.

In particular, embodiments of a TRNG as presented herein may utilize an architecture that includes a photonic entropy source where, two sources of physical entropy may be derived from the photonic entropy source. Such a photonic entropy source may be utilized to produce photon sequences at randomly distributed time intervals as well as random superimposed quantum states. Thus, a random sequence of time intervals of the production of photons, and the randomness present in measurements of a superimposed quantum state based on those photons, may be utilized as simultaneous, but independent sources of entropy. Such a superimposed quantum state may be created, for example, by passing the photon or some other quantum information carrier through a quantum logic gate such as a Hadamard gate or Chrestenson gate.

According to the photonic embodiment then, each production of a photon from a photon source will result in two non-correlated values. A duration determined from measuring the time interval between the production of a detected photon and the detection of the last photon and a measurement of the decoherence of a superimposed quantum state (e.g. resulting from passing the detected photon through a quantum logic gate prior to measurement). After some number of (e.g., N) photons are produced by the single-photon source, a set of (e.g., N) time intervals determined from measuring the time intervals between the production of these photons may be supplied as one input to a multi-radix extractor to determine the quantiles for those measured time intervals, where the number of quantiles is based on the radix of the extractor (where the radix may be greater than two). The multi-radix extractor thus can produce a set of (e.g., N) random values with a corrected distribution from the originally measured time intervals.

A set of (e.g., N) values corresponding to the measurements of the superimposed quantum state (e.g., if a photon is present on a particular output of a quantum logic gate) for each of the photonic events may be provided to an extractor (which may be a binary or multi-radix extractor) to produce a set of (e.g., N) random values with a correct distribution from the measurements of the superimposed quantum state. Thus, each of the set of random values produced from each extractor may correspond to a single photonic event (e.g., production of a photon) with corresponding values in each set of values corresponding to the same photonic event. In other words, the first random value in the set of random values produced from the measured time intervals and the first random value in the set of random values produced by the measurement of a superimposed quantum state correspond to the same photonic event. The set of random values produced from the measured time intervals by the multi-radix extractor and the set of random values produced by the measurement of a superimposed quantum state by the extractor may be provided to a composite extractor to generate a random bitstring as the output of the TRNG, where corresponding values in each set of values are composited to generate the resulting bitstring.

Embodiments of such a TRNG may be implemented, for example, on a hybrid integrated circuit containing both photonic and digital processing where the extractor functions are implemented either within an on-chip circuitry such as in digital logic or in or embedded electronic processor core or by some other combination of hardware and software. Embodiments of TRNGs as presented herein thus take advantage of multiple sources of entropy utilizing a multi-radix extractor. The total amount of harvested entropy in such TRNGS can exceed that compared to a design that makes use of only one of these sources. Accordingly, embodiments of TRNGs as disclosed may produce higher quality random values, due to the independent nature of the different raw entropy sources, and also with substantially higher throughput than single entropy-source designs, while being inexpensive, rugged and reliable.

These, and other, aspects of the disclosure will be better appreciated and understood when considered in conjunction with the following description and the accompanying drawings. It should be understood, however, that the following description, while indicating various embodiments of the disclosure and numerous specific details thereof, is given by way of illustration and not of limitation. Many substitutions, modifications, additions and/or rearrangements may be made within the scope of the disclosure without departing from the spirit thereof, and the disclosure includes all such substitutions, modifications, additions and/or rearrangements.

BRIEF DESCRIPTION OF THE DRAWINGS

The drawings accompanying and forming part of this specification are included to depict certain aspects of the disclosure. It should be noted that the features illustrated in the drawings are not necessarily drawn to scale. A more complete understanding of the disclosure and the advantages thereof may be acquired by referring to the following description, taken in conjunction with the accompanying drawings in which like reference numbers indicate like features and wherein.

DETAILED DESCRIPTION

The disclosure and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure the invention in detail. It should be understood, however, that the detailed description and the specific examples, while indicating some embodiments of the invention, are given by way of illustration only and not by way of limitation. Various substitutions, modifications, additions and/or rearrangements within the spirit and/or scope of the underlying inventive concept will become apparent to those skilled in the art from this disclosure.

Figure 1:
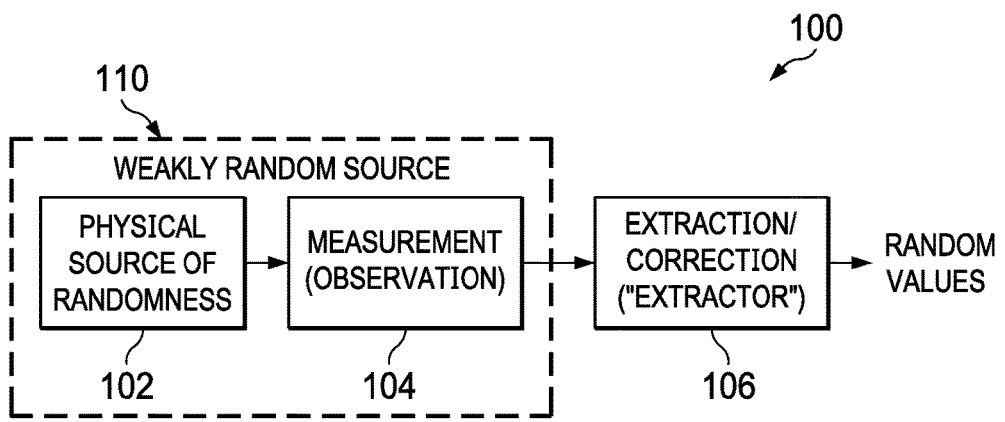
FIG. 1 is a block diagram of an architecture for a quantum entropy-based random number generator.

Before discussing embodiments in more detail, it may be helpful to give a general overview of certain aspects pertaining to embodiments. As may be recalled from the above discussion, high-speed and high-quality random number generators are desired in a variety of computing and cyber-security applications. Looking first at FIG. 1, an architecture for a true random number generator (TRNG) 100 is depicted. TRNG 100 includes a physical source 102, an observation or measurement stage 104 and a post-measurement processing stage 106 known as an "extractor" function. The physical source 102 produces a source of randomness, the measurement stage 104 observes the source of randomness 104 and provides the observations to the extractor function 106 that transforms the measured output of the physical source 102 into random values that can be output and used for a variety of purposes. Many different weakly random sources 100 have been identified and may be used in TRNG 100, such as those based upon quantum effects, electronic metastability, electronic chaos generation, radioactivity, thermal effects, atmospheric effects, deep space radiators, and others. Because the theory of observing the results of quantum mechanical interactions is based on probabilistic axioms, entropy sources 102 that rely upon the measurement or observation of superimposed quantum state may be used as sources in TRNG 100.

One of the reasons that physical sources 102 (e.g., and observation or measurement stage 104) used in TRNGs 100 are sometimes referred to as a "weakly random source" 110 is that it is practically impossible to measure or observe the source 102 output without adding some degree of determinism, bias, or correlation. For this reason, TRNG 100 usually incorporates extractor functions 106, or simply "extractors," that transform the output of a weakly random source 110 into an equally likely (i.e., with a uniform probability distribution) and independent string of random bits that can be output as the random values of the TRNG 100. More specifically, the purpose of the extractor 106 is to discard the undesired biases, correlations, or other deterministic components in the source measurements provided by measurement stage 104 and to transform random values to output values that are as close as possible to being independent and equally likely. From an information theoretic point of view, the goal of the TRNG extractor 106 is to maximize the information entropy in the output values by utilizing as much of the entropy present in the physical source 102 as possible. Furthermore, the extractor function 106 ideally produces values that are independent and uniformly distributed regardless of the native distribution of the physical source observations produced by measurement stage 104. For at least these reasons, extraction functions 106 are very important with regard to the quality of TRNG 100 output values.

While TRNG 100 may operate using a single source of entropy, in many cases the quality of the random values produced by a TRNG 100 may be improved by using two or more sources of entropy. However, these multiple sources must be separate and independent (i.e., uncorrelated). It will be noted here that the concept of a single source of entropy may be considered as different than a single physical source of entropy. In many cases, multiple sources of entropy may be derived from a single physical source of entropy.

The quality of the random values produced by such TRNGs are quite important in modern computing. This situation exists at least because many computing devices require a continuous supply of random values to support the implementation of various modern cryptographic methods. The lack of such high-quality random number sources in otherwise secure computing systems has been the cause of several well-documented security breaches. Moreover, it is desirable for the generation of these random bit streams to be accomplished at high data rates to support applications such as modern secure high-speed communications. This need is coupled with the added constraint that random values must be of very high quality in terms of their independence and other statistical properties in order to preserve the integrity of, for example, encryption protocols or other computing operations based on such random numbers. Additionally, it is desirable that high-speed and high-quality random number generators should be as inexpensive, rugged, and reliable as possible when the hosting devices are intended to be mass-produced.

To address those needs, among others, embodiments as disclosed that provide enhanced throughput and quality of output, through the use of a multi-source extractor function that may utilize (at least) two sources of entropy, which may, for example, be derived from the same physical source. To address this need, among others, attention is directed to embodiments of systems and methods for a multi-source (e.g., two or more) true random number generator (TRNG). A set of values is generated from each of the sources of randomness and an extractor is applied each of the sets of values to produce a further set of processed (extracted) random values from each source. In the embodiment illustrated herein, at least one extractor for at least one of the sources is a multi-radix extractor. The sets of values generated from each source of randomness can be combined by a composite extractor to generate a random bitstring as the output of the TRNG, where each value in a particular set of values is composited with a corresponding value in each of the other set of values to generate the bitstring. The sources of randomness may, in one case, be physically observable occurrences, such the observation of quantum state information such as the detection of a photon or the like. Other sources of randomness may be utilized and are full contemplated herein without loss of generality.

According to one embodiment, a TRNG may utilize two sources of randomness derived from a (e.g., single) photonic source, a random sequence of time intervals, and the randomness present in measurements of a superimposed quantum state. As such, embodiments may provide a TRNG that utilizes two or more sources of randomness, each source of randomness coupled to an associated extractor. At least one extractor of the TRNG utilized with a source of randomness may be a multi-radix extractor. While the term multi or multiple will generally be understood as meaning two or more, in the specific context of the multi-radix extractor described here, the term multi-radix will be understood to mean greater than two. The extracted values produced by the at least one extractor may be provided to a composite extractor that combines the extracted values in order to produce the random values output by the TRNG.

In one embodiment, a TRNG may be implemented in a Quantum Photonic Integrated Circuit (QPIC) using location-encoded (a.k.a., "dual-rail") methods for information representation. Such a source may be utilized in a photonic architecture with photonic information carriers to extract at least two independent bit streams in an efficient manner. To illustrate in more detail, according to one embodiment the output of a photon source is provided to a first stage photon detector and a photonic superposition operator (e.g., such as a Hadamard gate or Chrestenson gate). The output of the photonic operator is, in turn, provided to one or more additional (second-stage) photon detectors. The output of each of the first and second stage photon detectors is then provided to a logical function or circuit that may be implemented in hardware, software, or some combination of the two. In a similar way, an alternative embodiment may make use of a quantum function that includes a general (i.e., not necessarily photonic) quantum superposition operator combined with a controlled-input (or entanglement) quantum logic gate, such as a CNOT, wherein at least one of the outputs of the quantum logic gate is subsequently measured.

Specifically, the output of the first stage photon detector may be provided to a first extractor in the logical circuit that may, for example, be a multi-radix extractor. The output of the at least two photon detectors is provided to a second extractor in the logical circuit that may, for example, be a binary, or higher, radix extractor. The outputs of each of the first extractor and the second extractor are provided to a composite extractor which combines the output of the first extractor and the second extractor to produce a random value as the output of the TRNG. Embodiments of such a TRNG can be implemented, for example, using a circuit (e.g., a dedicated hardware logic block embedded in a chip or a Field Programmable Gate Array (FPGA)) and where the optical components are implemented in a photonics layer of such a circuit and the integrated circuitry components, such as the entropy extractors, may be implemented on a standard Complementary Metal Oxide Semiconductor (CMOS) layer of the circuit.

In particular, embodiments of a TRNG as presented herein may utilize an architecture that includes a photonic entropy source where, two sources of physical entropy may be derived from the photonic entropy source. Such a photonic entropy source may be utilized to produce photon sequences at randomly distributed time intervals as well as random superimposed quantum states. Thus, a random sequence of time intervals of the production of photons, and the randomness present in measurements of a superimposed quantum state based on those photons, may be utilizes as sources of entropy. Such a superimposed quantum state may be created, for example, by passing the photon through a quantum logic gate such as a Hadamard gate or Chrestenson gate.

According to embodiment then, each production of a photon from a photon source will result in two non-correlated values. A time interval determined from measuring the time interval between the production of the last photon and the photon and a measurement of a superimposed quantum state resulting from passing a photon through a quantum logic gate. After some number of (e.g., N) photons are produced by the photon source, a set of (e.g., N) time intervals determined from measuring the time intervals between the production of these photons may be provided to a multi-radix extractor to determine quantiles for those measured time intervals, where the number of quantiles is based on the radix of the extractor (where the radix may be greater than two). The multi-radix extractor thus produces a set of (e.g., N) random values with a uniform distribution from the (potentially non-uniformly distributed) measured time intervals.

Figure 2:
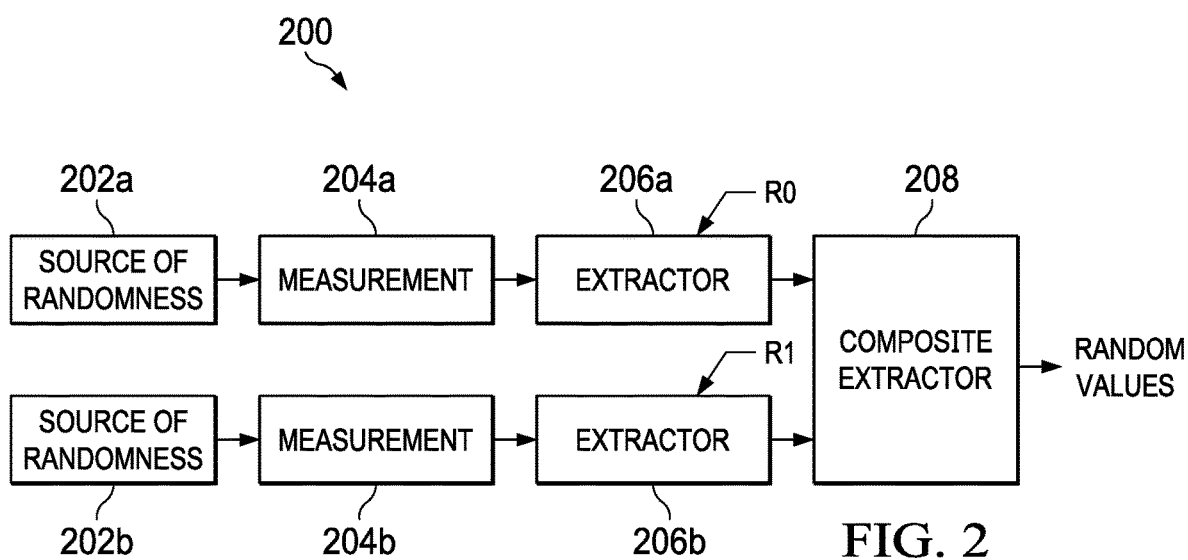
FIG. 2 is a block diagram of one embodiment of an architecture for a multi-source, multi-radix TRNG.

A set of (e.g., N) values corresponding to the measurements of the superimposed quantum state (e.g., if a photon is present on a particular output of a quantum logic gate) for each of the photonic events may be provided to an extractor (which may be a binary or multi-radix extractor) to produce a set of (e.g., N) random values with a corrected distribution from the measurements of the superimposed quantum state. Thus, each of the set of random values produced from each extractor may correspond to a single photonic event (e.g., the production of a photon) with corresponding values in each set of values corresponding to the same photonic event. In other words, the first random value in the set of random values produced from the measured time intervals and the first random value in the set of random values produced by the measurement of a superimposed quantum state correspond to the same photonic event. The set of random values produced from the measured time intervals by the multi-radix extractor and the set of random values produced by the measurement of a superimposed quantum state by the extractor may be provided to a composite extractor to generate a random bitstring as the output of the TRNG, where corresponding values in each set of values are combined to generate the resultant bitstring Moving on to FIG. 2, a block diagram of a TRNG 200 according to one embodiment is disclosed. TRNG 200 includes sources of randomness 202, where the output of each source of randomness 202 (which may originate from the same physical source of randomness) is provided to a corresponding measurement block 204 for outputting measured values based on the random input value originating from the corresponding source of randomness 202. The output of each measurement block 204 may be provided to a corresponding extractor 206. For example, a first source of randomness 202a may be measured by a first measurement block 204a and measured first output values provided to a first extractor 206a, while a second source of randomness 202b may be measured by a second measurement block 204b and measured second output values provided to second extractor 206b.

A first instance of the extractors 206a may transform the first measured output values from measurement block 204a based on a multi-radix (e.g., R0) transformation to produce one or more transformed first output values. Such a extractor is described in "Multiple-Valued Random Digit Extraction" by Micah Thornton and Mitchell Thornton in Proceedings of the IEEE International Symposium on Multiple-Valued Logic (ISMVL) pp. 162-167, Vol. 1, May 2018, incorporated herein by reference in its entirety for all purposes (referred to subsequently herein as "[TT:18]"). A second one of the extractors 260b may transform the measured second output values measured by measurement block 204b based on a binary (or more) radix (e.g., R1) transformation to produce one or more transformed second output values.

The first transformed output values produced by the first extractor 206a and the second transformed output values produced by the second extractor 206b are provided to composite extractor 208, which determines the random values output by the TRNG 200 based on the first transformed output values and the second transformed output values. This determination may be accomplished, for example, by concatenating each of the first transformed output values with a corresponding one of the second transformed output values, or by inserting a second transformed output value into any arbitrary location within the corresponding first transformed output value.

As discussed, many different weakly random sources of entropy have been identified and used in TRNGs. While these entropy sources may be utilized in various embodiments, because the theory of observing the results of quantum mechanical events is based on probabilistic axioms, entropy sources that rely upon the measurement or observation of superimposed quantum state information may be utilized in certain embodiments. These embodiments of a TRNG may utilize such a source with photonic information carriers to extract (at least) two independent bit streams in an efficient manner and utilize these bit streams as sources of randomness.

Figure 3:
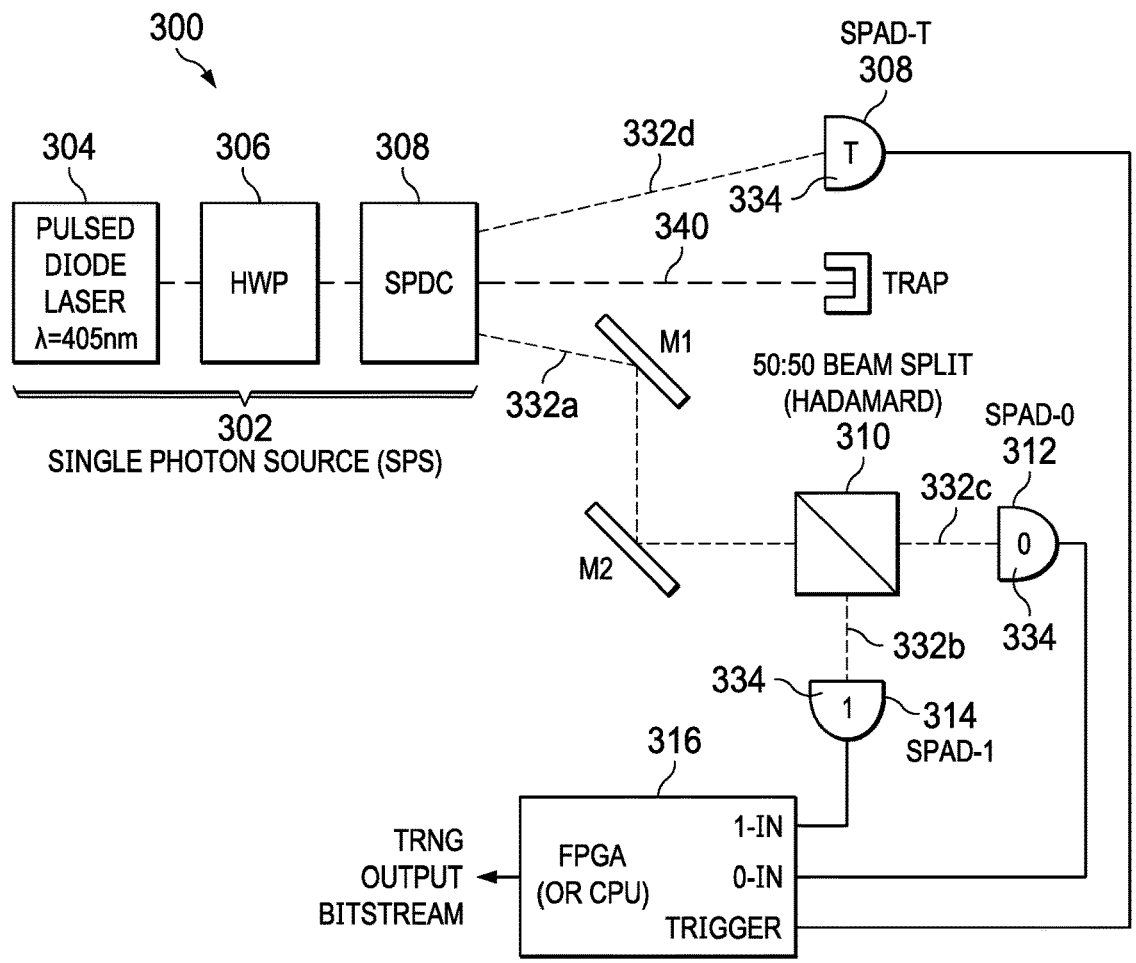
FIG. 3 is a block diagram of one embodiment of an architecture for a multi-source, multi-radix TRNG.

Referring to FIG. 3 then, a block diagram of one embodiment of TRNG 300 that utilizes photonic information as a source of randomness is presented. Here, a laser 304 excites a spontaneous parametric down conversion (SPDC) device 308 to generate a heralded single photon source in the form of a signal and idler (also referred to as a trigger) photon pair. The idler photon 340 is transmitted in a waveguide 332d that enables a heralded implementation. The signal photon is transmitted via a waveguide 332a to a 50-50 beam splitter 310, used as a Hadamard operator, that drives the two waveguides 332b, 332c representing orthogonal basis states, $|0\rangle$ and $|1\rangle$.

Specifically, a Hadamard operator or gate acts on a single qubit. It maps the basis state $|0\rangle$ t $$\frac{|0\rangle + |1\rangle}{\sqrt{2}}$$

and $|1\rangle$ to $$\frac{|0\rangle - |1\rangle}{\sqrt{2}},$$

which means that a measurement on that state will have equal probabilities to become 1 or 0 (i.e., it creates a superposition). It represents a rotation of $\pi$ about the axis $(\hat{x}+\hat{z})/\sqrt{2}$. Equivalently, it is the combination of two rotations, $\pi$ about the X-axis followed by $$\frac{\pi}{2}$$

about the Y-axis. It is represented by the Hadamard matrix:

$$H = \frac{1}{\sqrt{2}}\begin{bmatrix} 1 & 1 \\ 1 & -1 \end{bmatrix}.$$

Each of the three waveguides 332b, 332c, 332d, drives a respective single-photon avalanche diode (SPAD) 334 detector that are denoted as SPAD-0 312, SPAD-1 314, and SPAD-T 308. Thus, a random bit stream is produced by the TRNG 300 depending upon which of SPAD-0 312 and SPAD-1 314 indicate a photonic detection event that is correlated in time with an active output from SPAD-T 308.

As an example, single photon source (SPS) 302 is comprised of a pulsed laser source 304 with, for example, wavelength 405 nm serving as a pump and a rotatable half-wave plate (HWP) 306 for adjusting the angle of linear polarization of the pump photon with the optical axis of the spontaneous parametric down converter (SPDC) 308. The down-converted signal and idler photons are at, for example, 810 nm wavelength. One photon emitted by SPDC 308 is the idler photon and is conducted on waveguide 332d to be detected by SPAD-T 308, whereas the other photon produced by the SPDC 308 is indicative of the signal photon beam on waveguide 332a, where the path of the waveguide 332a is adjusted via mirrors M1 and M2 prior to entering the beam splitter 310. The beam splitter 310 serves as a location-encoded Hadamard operator, thus causing the position state of the signal photon on waveguide 332a to be equiprobable (e.g., on waveguides 332b and 332c).

The two output waveguides 332b, 332c of the beam splitter 310 and the waveguide 332d for the idler photon are applied to detectors, SPAD-0 312, SPAD-1 314, and SPAD-T 308, each of which designed to produce an electronic signal on a respective electronic output when a photon is detected. Each of the outputs of SPAD-0 312, SPAD-1 314, and SPAD-T 308 supply respective input signals (e.g., "0-in", "1-in", ""Trigger") to a circuit 316 (which may be hardware, software or the combination of the two such as an FPGA or processor). The circuit 316 generates an output of random values for the TRNG 300 based on the input signals received due to detection from SPAD-0 312, SPAD-1 314, and SPAD-T 308 based on which detector(s) SPAD-0 312, SPAD-1 314 or SPAD-T 308 were activated.

In particular, according to embodiments, circuit 316 is adapted to take advantage of two sources of entropy from the SPS 302. A physical photon entropy source such as the SPS 302 as implemented in TRNG 300 exhibits at least two different and statistically independent random characteristics. The first source of randomness is a sequence of measurements based upon whether energy is detected at SPAD-0 312 or SPAD-1 314 as just described. The second source of randomness is the sequence of time intervals between photon detection events at SPAD-T 308. It is irrelevant whether detection occurs at either SPAD-0 312 or SPAD-1 314 with respect to the sequence of time intervals separating photon generation (e.g., by physical source 302). Thus, the time interval sequence is statistically independent with respect to the sequence of generated bits due to SPAD-0 312 or SPAD-1 314. Therefore, SPS 302 can provide two independent entropy sources (i.e., source of randomness) that are statistically independent.

As discussed, TRNGs based upon two (or more) sources can be superior as compared to a single source TRNG. Thus, embodiments as disclosed may utilize two-sources of randomness in the TRNG 300 by utilizing two random variables (RV) where one is a Bernoulli distributed RV, X, and the other is a time series of sub-Poissonian distributed time intervals denoted as RV Y that originate as characteristics of the same single SPS 302. The circuit 316 thus receives inputs from SPAD-T 308, SPAD-0 312, and SPAD-1 314. Internally the circuit 316 implements extractor functions for each of these sources of randomness and produces a random bitstream as output (e.g., in addition to other signal conditioning and control functions) based on both these sources of randomness.

Accordingly, circuit 316 includes an extractor for the Bernoulli distributed RV X with variate $x_i$ that is denoted $Ext_2(X)$ and utilizes the inputs 0-in and 1-in coupled to the outputs of SPAD-0 312 and SPAD-1 314, respectively. Here, RV V with variate $v_i$ is denoted as the value of variate $x_i$ extracted by this extractor. The RV V has two possible outcomes and hence the event space is $\mathbb{F}_2=\{0, 1\}$.

Circuit 316 may also include an extractor adapted to implement an extractor function, $Ext_r(Y; r)$, for the sub-Poissonian distributed RV Y (e.g., as referred to in [TT:18]). RV W with variate $w_i$ is extracted from RV Y via the use of $Ext_r(Y; r)$ by this extractor. The variates, $y_i$, of Y as utilized in this embodiment are of the form of a discretized (also referred to as quantized) set of time intervals, $\Delta t_i$. In certain embodiments, the $w_i$ values are radix-R values in the form of a bitstring of length r that have values $w_i \in \mathbb{F}_r=\{0, 1, \ldots, 2^r-1\}$ where the number of different bitstrings is also $|\mathbb{F}_r|=R$ and where $R=2^r>2$. This extractor for $Ext_r(Y; r)$ receives the output from SPAD-T 308 as received at the trigger input of the circuit 316.

Circuit 316 includes a composite extractor adapted to combine the output of the extractor function $Ext_2(X)$ and the extractor function $Ext_r(Y; r)$ to yield the random values output by the TRNG 300. Because X and Y are statistically independent and uncorrelated, the overall composite extractor of TRNG 300 is formed from $Ext_2(X)$ and $Ext_r(Y; r)$ and is denoted as $Ext(X, Y; r)=Ext_2(X)||Ext_r(Y; r)$ where|| denotes the concatenation operation. The order of concatenation is arbitrary and irrelevant. Generally, any arbitrary permutation of the bitstrings resulting from $Ext(X, Y; r)$ would suffice due to the fact that V and W are equally likely and independent.

TRNG 300 with a quantum photonic source and a composite extractor function $Ext(X, Y; r)=Ext_2(X)||Ext_r(Y; r)$ thus yields generated values that are uniformly distributed when $Ext_2(X)$ produces a uniformly distributed RV V and $Ext_r(Y)$ produces a uniformly distributed RV W. This is the case at least because the probability that a variate of V is a value in the set $\mathbb{F} 2=\{0, 1\}$ is ½, since V is uniformly, or in this case, Bernoulli distributed with probability of success Z. Likewise, the probability that a variate of RV W is a value in the set $\mathbb{F}$ F is ½, since W is also uniformly distributed. Since RVs V and W are independent, the probability of the r+1 bit concatenated variate of RV S, or $s_i=v_i|| w_i$ is $$P[V||W] = P[X \cap Y] = P[X]P[Y] = \frac{1}{2^{r+1}}.$$

Figure 4:
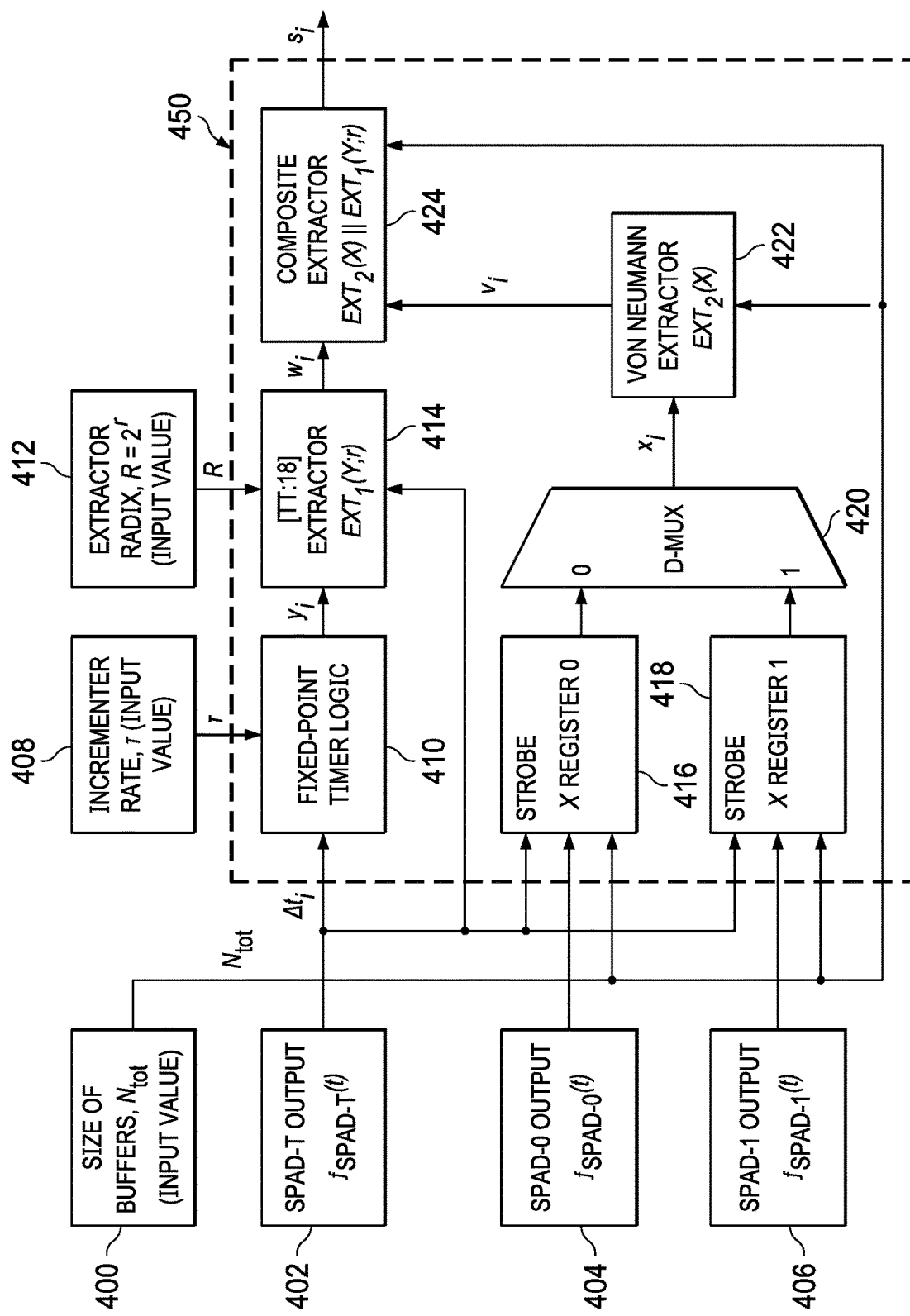
FIG. 4 is a block diagram of one embodiment of an architecture for circuit for use in a multi-source, multi-radix TRNG.

Referring then to FIG. 4, a block diagram of one embodiment of a circuit 450 for use in a multi-source, multi-Radix TRNG such as that depicted in FIG. 3 is presented. Circuit 450 may, for example, be realized, at least partially, as hardware logic (which may be implemented in an FPGA) or as software executing on a processor. Circuit 450 includes fixed-point timer logic (FPTL) 410, that takes as input the incrementor rate $\tau$ denoting the internal sampling clock period ($\tau$). This incrementor rate may be smaller than the measurement coincidence window. FPTL 410 also receives as input the output of the SPAD-T detector 402 (e.g., the trigger input) and outputs variates, $y_i$, of Y that can be utilized in this embodiment as a form of discretized set of time intervals.

The output of the FPTL 410 is provided to extractor 414. An extractor radix value 412 is also provided as input to the extractor 414. Here, in this embodiment, R may be associated with the internal sampling clock period that is smaller than the measurement coincidence window. The radix value, $R=2^r$ is used by extractor 414 to quantize the timing intervals $\Delta t_i$ that yield the sub-Poissonian distributed variate $y_i \in [n_1, n_2]$. Specifically, in one embodiment, R is the number of quantiles for extractor 414 to utilize. Extractor 414 may thus implement a non-linear function that maps the sub-Poissonian distributed values received from the FPTL 410 to a uniform probability distribution by assigning each of the values received from the FPTL 410 to one of R number of quantiles.

Specifically, extractor 414 implements the extractor function, $Ext_r(Y; r)$, for the sub-Poissonian distributed RV Y (e.g., as referred to in [TT:18]). RV W with variate $w_i$ is extracted from RV Y via the use of $Ext_r(Y; r)$ by this extractor 414. The variates, $y_i$, of Y as utilized in this embodiment are of the form of a discretized set of time intervals, $\Delta t_i$. In certain embodiments, the $w_i$ values are radix-R values in the form of a bitstring of length r that have values $w_i \in \mathbb{F}_r = \{0, 1, \ldots, 2^r-1\}$ where the number of different bitstrings is also $|\mathbb{F}_r|=R$ and where $R=2^r>2$ as provided by the extractor radix input 412.

Circuit 450 also includes X register 0 416 and X register 1 418 with buffer size $N_{tot}$ as provided by buffer size input value 400 where each of X register 0 416 and X register 1 418 is strobed by the output of SPAD-T 402. Thus, N designates the number of values to accumulate before performing extraction and composition of those values. X register 0 416 receives the output of SPAD 0 404 while X register 1 418 receives the output of SPAD 1 406. The output of each of X register 0 416 and X register 1 418 is coupled to D-MUX 420 which can output either a "0" or "1" electronic bit into the extractor 422 logic circuit depending on which of SPAD-0 404 or SPAD-1 406 was activated. Extractor 422 may implement an extractor for the Bernoulli distributed RV X with variate $x_i$ that is denoted $Ext_2(X)$ and utilizes the inputs 0-in and 1-in coupled to the outputs of SPAD-0 312 and SPAD-1 314, respectively. Here, RV V with variate $v_i$ is denoted as the value of variate xi extracted by this extractor 422. The RV V has two possible outcomes and hence the event space is $\mathbb{F}_2 = \{0, 1\}$.

The outputs of each of the extractors 414 and extractor 422 are provided to composite extractor 414 which acts to combine the output of the extractor function $Ext_2(X)$ and the extractor function $Ext_r(Y; r)$ to yield the random values output by the TRNG 300. Because X and Y are statistically independent and uncorrelated, the overall composite extractor of TRNG 300 is formed from $Ext_2(X)$ and $Ext_r(Y; r)$ and is denoted as $Ext(X, Y; r) = Ext_2(X) \| Ext_r(Y; r)$ where $\|$ denotes the concatenation operation. The order of concatenation is arbitrary and irrelevant. Generally, any arbitrary permutation of the bitstrings resulting from $Ext(X, Y; r)$ would suffice due to the fact that V and W are equally likely and independent.

To illustrate in more detail, the parameters of the circuit 450 $\tau$ and R denote the internal sampling clock period ($\tau$) that, in one embodiment, is smaller than the measurement coincidence window. Additionally, the fact that the signal (e.g., SPAD-0 and SPAD-1) and idler (e.g., SPAD-T) pairs are produced simultaneously can potentially be used to provide an enhanced signal to noise ratio for the SPAD-0 and SPAD-1 signals, by temporally qualifying the SPAD-0 and SPAD-1 output measurements. Thus, any unwanted, non-correlated signals that occur in the SPAD-0 and SPAD-1 detectors (e.g., due to external factors, such as so-called "dark-count" measurements) can be reduced.

The radix value, $R=2^r$ is used to quantize the timing intervals $\Delta t_i$ that yield the sub-Poissonian or other distributed variate $y_i \in [n1, n2]$ from extractor 414. Each time a new idler photon is detected at SPAD-T 402, the FPTL 410 begins a processing cycle. The FPTL 410 computes $\Delta t_i = t_{i+1} - t_i$ as a quantized value in the form of an r-bit word yi. The FPTL 410 includes an internal incrementer register that is reset by a rising edge on the output of the SPAD-T detector 402 and it is configured as an up-counter that increments every $\tau$ time units as a means to compute $\Delta t_i$. When an idler photon is detected by the SPAD-T 402, the incrementer of FPTL 410 first outputs its current discretized count value $y_i$ to the extractor 414, then FPTL 410 resets and begins counting again from zero. The output value of the incrementer of FPTL 410 is thus the quantized value of $\Delta t_i$ representing an observation of RV Y for the previous time interval between photon detections with a resolution set by parameter $\tau$. Note that $y_i$ is not necessarily restricted to being r bits in length as is its extracted value, $w_i$.

As discussed, extractor 414 implements the extractor function denoted as $Ext_r(Y; r)$ as described in [TT:18]. Extractor 414 thus produces an r-bit value $w_i$ whose value is in the set $F_r = \{0, 1, 2^{r-1}\}$ and that is uniformly distributed and produced from the input quantized yi values produced from FPTL 410 (and derived from corresponding $\Delta t_i$) values that are both sub-Poissonian (or otherwise) distributed. This extractor 414 also contains a buffer of a length suitable length to store $N_{tot}$ different $y_i$ and $w_i$ sample values. The extractor 414 receives $N_{tot}$ quantized $y_i$ values from FPTL 410, applies them to the $Ext_r(Y; r)$ function, and yields $N_{tot}$ different $w_i$ output values using the extraction methodology described in [TT:18].

Again, the sequence of measured time intervals between photonic events (e.g., photon detection events) is representative of a sub-Poissonian (or other non-uniform) process and is denoted by RV Y. The variates $y_i$ of RV Y are discretized values representing each interval $\Delta t_i$. The detection coincidence window values, $T_{win}$, are chosen and used in the circuit 450 in relation to the photon source (e.g., the SPS) parameters to ensure that the time intervals between detection pulses from SPAD-T are indeed distributed in a sub-Poissonian (or other non-uniform) manner, thus minimizing photon number bunching within a measurement interval.

The actual $\Delta t_i \in R$ time intervals may be positive, real, and non-zero. Due to the fact that the embodiments of a TRNG are implemented with a hybrid of photonic, analog, and digital electronic circuitry, the observation and measurement of RV Y results in a discrete positive integer-valued variate, $y_i$, from the interval $y_i \in [n1, n2]$. The integer-valued $y_i$ measurement estimates the actual real-valued $\Delta t_i$ value via the relationship $y_i = \lceil \Delta t_i \times \tau \rceil$ where $\tau$ is the clock period of a digital incrementer circuit or counter within the TRNG that counts the number of T time intervals that elapse between adjacent photon detection events in time.

Figure 5:
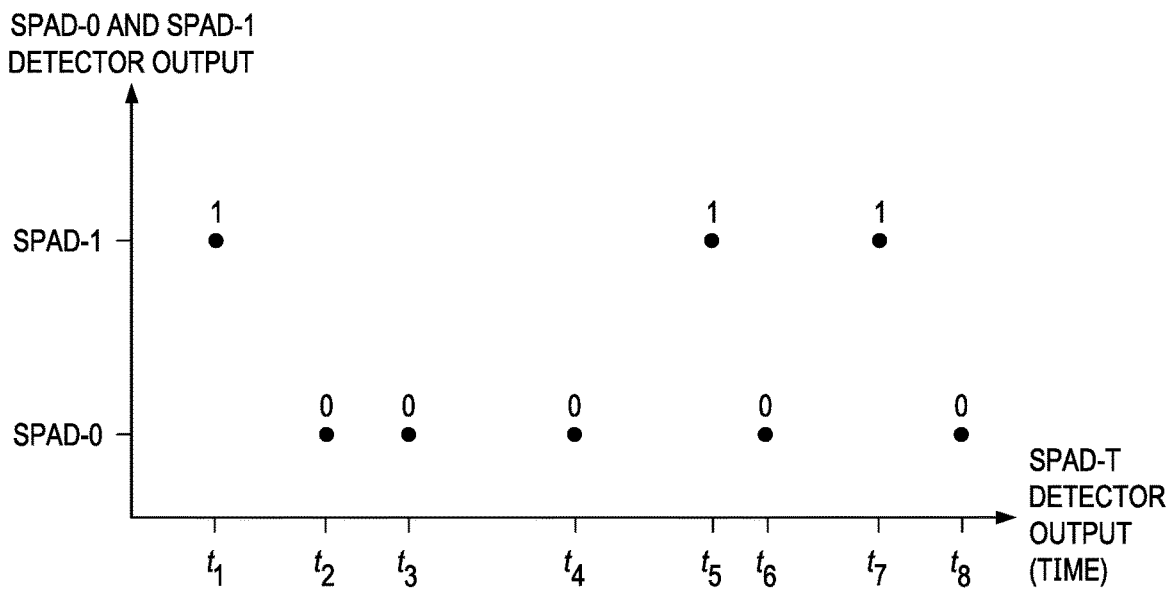
FIG. 5 is a graph illustrating example data.

Looking briefly at FIG. 5, an example a plot of detector activations in embodiments of a TRNG is depicted. The heralded detector output is indicated on the horizontal axis representing the SPAD-T 402 detector when it detects the presence of an idler photon as shown via a tick mark labeled $t_i$. $t_i$ is the time at which the SPAD-T 402 detects an incident idler photon causing a rising edge of $f_{SPAD}$. The vertical axis is labeled with two events; the detection of a signal photon at either the SPAD-0 404 or SPAD-1 406 detector. Each dot on the plot of FIG. 5 indicates whether the signal photon was detected by the SPAD-0 404 or SPAD-1 406 detector. Theoretically, the signal photon is equally likely to be detected at either the SPAD-0 404 or the SPAD-1 406 detector since it is placed into maximal and equal superposition (e.g., due to the Hadamard operator realized as a beam splitter and the resulting extracted vi value as shown in FIG. 3).

Accordingly, FIG. 5 actually indicates two statistically independent random processes. The first is modeled as RV V and is the equally likely event that the signal photon is detected by either the SPAD-0 404 or SPAD-1 406 detector. The second process, denoted as event RV X, corresponds to the event that the idler photon is detected by SPAD-T 402 at some time interval $\Delta t_i$ where $\Delta t_i = t_{i+1} - t_i$. Alternatively, the two sets of observations of RVs shown in FIG. 5 can be interpreted as the set of X observations, {1, 0, 0, 0, 1, 0, 1, 0} and the set of Y observations {y1, y2, y3, y4, y5, y6, y7} are the discretized values representing {$\Delta t_1$, $\Delta t_2$, $\Delta t_3$, $\Delta t_4$, $\Delta t_5$, $\Delta t_6$, $\Delta t_7$}. In terms of information theory, each observation of X and Y yields some amount of self-information of the corresponding extracted values $v_i$ and $w_i$, denoted as $I(v_i)$ and $I(w_i)$. The self-information, in units of bits, that corresponds to the event that RV A is observed to have an outcome of $a_i$ (i.e. A=$a_i$) is given in Equation 1.

$$I(A=a_i)=-\log_2[P(A=a_i)] \quad (\text{Eq. 1})$$

Returning to FIG. 4, the outputs of SPAD-0 404 and SPAD-1 406 are registered into (e.g., single bit) registers X register 0 416 and X register 1 418 respectively, for each photonic event, depending upon which of SPAD-0 404 and SPAD-1 406 outputs a pulse for that photonic event. X register 0 416 and X register 1 418 have values that are strobed in only when the SPAD-T 402 rising edge occurs, thus ensuring that the SPAD-0 404 and SPAD-1 406 activations are due to an actual produced signal/idler pair from the physical source (e.g., the SPDC of the TRNG) versus some other spurious or extraneous detections. After an appropriate delay in the SPAD-T output signal 402 (e.g., as indicated by a non-illustrated delay element) the demultiplexer logic 420 outputs either a "0" or "1" bit into the extractor 422 logic circuit, depending on which of SPAD-0 404 or SPAD-1 406 was activated.

Extractor 422 may be binary (or greater) radix extractor. For example, extractor 422 may be a von Neumann extractor in one embodiment, but may be another type of extractor in other embodiments. Thus, it should be noted here that the correct operation of this circuit 450 does not depend on the choice of a von Neumann extractor for any of these functions Ext$_2$(X), Extr(Y; r), etc. In this case, and in other embodiments, it should be understood that other embodiments of the structure described herein may use other extractor constructions, such as to operate on the binary signals produced at the output of the demultiplexer logic 420. In this embodiment, von Neumann Ext$_2$(X) extractor logic 422 includes an internal buffer in the form of a serial input shift register that is also of length $N_{tot}$. When $N_{tot}$ bits representing variates of RV X have been accumulated, the von Neumann extractor function evaluates, thus ensuring that the samples, $v_i$, of RV V are indeed equiprobable.

The detection of photons by either SPAD-0 or SPAD-1 according to certain embodiments is thus theoretically modeled as a sequence of events corresponding to observations of a Bernoulli-distributed random variable (RV), X, with parameter p. In the theoretically ideal case, the Hadamard operator which provides input to SPAD-0 and SPAD-1 is implemented with a perfect 50:50 beam splitter resulting in the Bernoulli PMF parameter p being exactly. However, as discussed, perfectly ideal beam splitters may not be realizable in the laboratory or in manufacturing environments. Thus, an extractor function may be used to adjust for practical tolerances in actual beam splitters.

Embodiments may thus model the output of a SPAD as the function $f_{SPAD}$ that has a nominal output of 0V. Upon detecting a photon at time t, $f_{SPAD}$ produces a rising edge of a short duration pulse where the constant $T_{SPAD}$ represents the short pulse-width characteristic of the SPAD and u(t) represents a unit step function. The SPAD characteristic behavior as modeled by $f_{SPAD}$ is $f_{SPAD}(t)=u(t)-u(t-T_{SPAD})$ when SPAD-T detects an idler photon at time t.

In considering the case of an ideal beamsplitter, the quantum state of the location-encoded photon is maximally superimposed and is of the form:

$$|\Phi\rangle = \frac{|0\rangle + |1\rangle}{\sqrt{2}}$$

since the parameter p in a Bernoulli probability density function is. This results in a photon detection event that is equally likely to happen in either SPAD-0 or SPAD-1 with probability of occurrence equal to in response to the production of a signal and idler pair from the physical source (e.g., the SPDC).

However, in terms of actual implementations of beam splitters, such an ideal case is almost never achieved in practice since the devices are fabricated within tolerance levels and may also suffer from other imperfections. Thus, embodiments of a TRNG with an architecture such as that in FIG. 3 is more realistically modeled with the parameter p being of the form p≠½. For this reason, a von Neumann extractor function may be employed for extractor 422, although other previously known extractors such as the Trevisan, Toeplitz hashing, or other approaches as appreciated by one skilled in the art, may be used (e.g., depending upon the intended application of the TRNG) without loss of generality. Extractor Ext$_2$(X) thus, produces the extracted sequence of variates vi from the extracted RV V.

The composite extractor 424 (implementing Ext(X, Y; r)=Ext$_2$(X)||Ext$_r$(Y; r)) receives the $N_{tot}$ extracted bitstrings of length r, denoted as variates $w_i$, from the extractor 414 (Ext$_r$(Y; r)) and the corresponding $N_{tot}$ extracted bits from extractor 422 (implementing Ext$_2$(X)). Composite extractor 424 then concatenates each r-bit value $w_i$ (received from extractor 414) with each matching single bit extracted value $v_i$ (received from extractor 422) and outputs $N_{tot}$ concatenated bit strings, $s_i=v_i||w_i$ each of length r+1, as the output of the TRNG in which it is included. Although the composite extractor 424 (implementing function Ext(X, Y; r)=Ext$_2$(X) ||Ext$_r$(Y; r)) may perform concatenation of the two inputs received from extractor 414 and extractor 22 resulting in random bit substrings of the form $s_i=v_i||w_i$, the composite extractor 424 may also insert the random bit $v_i$, into any arbitrary location within the random bit string $s_i$ without any degradation in terms of TRNG output quality.

Accordingly, in the case of the information content of the strings resulting from the composite extractor function, Ext(X, Y; r)=Ext$_2$(X)||Ext$_r$(Y; r), the TRNG using such a circuit 450 provides a series of bit strings comprised of substrings, $s_i$, where $s_i$ is the concatenation of the r-bit string $w_i$ extracted from the $y_i$ variates using extractor Ext$_r$(Y; r)=$w_i$, and the corresponding single bit values $v_i$ extracted from variates $x_i$ using the von Neumann extractor $v_i$=Ext$_2$ (X). Thus, the TRNG produces a series of substrings $s_i$ that are comprised of r+1 bits formed as a concatenation $s_i=v_i||w_i$.

The concatenated string of r+1 bits, $s_i=v_i||w_i$, includes self information that is the arithmetic sum of the self information of $v_i$ and $w_i$. From the above it will be recalled that $s_i$, a variate of RV S, is uniformly distributed where $s_i=v_i||w_i$ and where $v_i$ and $w_i$ are each independent variates. Thus, $$P[s_i] = P[v_i||w_i] = P[v_i \cap w_i] = P[v_i]P[w_i] = P(v_i) \times P(w_i) = \left(\frac{1}{2}\right)\left(\frac{1}{2^r}\right) = \frac{1}{2^{r+1}}. \quad (Eq.\ 5)$$

Using the definition of self-information in Equation 1:

$$I(s_i) = -\log_2[P(v_i) \times P[w_i]] = -\log_2[P(v_i)] - \log_2[P(w_i)] = I(v_i) + I(w_i)$$

For the ideal Hadamard operator, the self-information due to an observation of RV X is one bit in the ideal case. For the RV W, the self-information due to the extracted value $w_i$ is based on a substring of size r. Since the extracted $w_i$ are ideally uniformly distributed, the self information is:

$$I(wi) = -\log 2[P(wi)] = -\log 2 = \left[\frac{1}{2^r}\right] = \log 2(2^r) = r \quad (Eq.\ 2)$$

Information entropy is the expected value of the self-information, $H(A)=E\{I(A)\}$.

Thus, for $N_{tot}$ observations of A, assuming each A is comprised of k bits, the corresponding information entropy in units of bits is given in Equation 3.

$$H(A)=E\{I(A)\}=\Sigma_{i=1}^{k \times N_{tot}}(A=a_i)P[I(A=a_i)] \quad (Eq.\ 3)$$

From probability theory, it is the case that $P[I(A=a_i)]=P[-\log_2\{P(i\ A=a_i)\}]=P[A=a_i]$, thus Equation 3 can be simplified to the well-known form in Equation 4.

$$H(A)=E\{I(A)\}=\Sigma_{i=1}^{k \times N_{tot}}(P[a_i])\log_2(P[a_i]) \quad (Eq.\ 4)$$

Accordingly, a TRNG with a quantum photonic source (e.g., SPS as depicted in FIG. 3) and a composite extractor function Ext(X, Y; r)=Ext$_2$(X)||Ext$_r$(Y; r) harvests more entropy from the physical source than a TRNG that uses only the extractor Ext$_2$(X) or only the extractor Ext$_r$(Y; r). To illustrate, RV X and Y are statistically independent since the generation of photon pairs from the SPDC in the TRNG depicted in FIG. 3 occurs probabilistically and before the generated signal photon is placed into a state of superposition by the beamsplitter and subsequently detected by either SPAD-0 or SPAD-1.

The $N_{tot}$ length sequence of $\{w_i\}$ is extracted from the $N_{tot}$—length sequence $\{y_i\}$ that are discretized values of $\{\Delta t_1, \Delta t_2, \Delta tN_{tot}\}$. While the $N_{tot}$—length sequence $\{y_i\}$ is a set of discretized sub-Poissonian (or other non-uniformly) distributed values of $\{\Delta t_1, \Delta t_2, \Delta tN_{tot}\}$, the corresponding $\{w_i\}$ sequence is a set of uniformly distributed length-r substrings due to extractor Ext$_r$(Y; r) that are independent with regard to the signal photon being placed into a state of superposition prior to its detection by either SPAD-0 or SPAD-1. Alternatively, the outcome of the extracted $v_i$ value from RV X is due to a fundamental axiom of quantum mechanics that is independent of the time intervals separating signal and idler pair generation from the SPDC.

The maximum amount of entropy available from a sequence of $N_{tot}$ variates $\{v_i\}$ extracted from RV X occurs when the beam splitter is ideal and hence the(e.g., von Neumann) extractor has 100% efficiency and yields $N_{tot}$ random bits when $N_{tot}$ bits are operated over by the extractor. Thus, since each bit is equally likely to be zero or one, the resulting harvested entropy due to Ext$_2$(X) is calculated on a per bit basis using Equation 4 resulting in Equation 5.

$$H(\{vi\}) = -\sum_{i=1}^{1 \times N_{tot}}(P[vi])\log 2(P[vi]) = -N_{tot}\left(\frac{1}{2}\right)\log 2\left(\frac{1}{2}\right) = \frac{N_{tot}}{2} \quad (Eq.\ 5)$$

Likewise, the entropy harvested from a sequence of $N_{tot}$ substrings of length r, $\{w_i\}$, extracted from RV Y by Ext$_r$(Y; r) is given by Equation 4 resulting in Equation 6.

$$H(\{wi\}) = -\sum_{i=1}^{r \times N_{tot}}(P[wi])\log_2(P[wi]) = -(r \times N_{tot})\left(\frac{1}{2}\right)\log 2\left(\frac{1}{2}\right) = \frac{N_{tot}}{2} \quad (Eq.\ 6)$$

Finally, the energy harvested from the sequence $\{s_i\}$ of length $N_{tot}$ using the composite extractor Ext(X, Y; r)=Ext$_2$(X)||Ext$_r$(Y; r) is given by Equation 4 resulting in Equation 7.

$$H(\{s_i\}) = -\sum_{i=1}^{(r+1) \times N_{tot}} P(s_i)\log_2[P(s_i)] = \\ -\sum_{i=1}^{(r+1) \times N_{tot}} P(v_i||w_i)\log_2[P(v_i||w_i)] = -\sum_{i=1}^{(r+1) \times N_{tot}} P(v_i \cap w_i)\log_2[P(v_i \cap w_i)] = \\ -\sum_{i=1}^{(r+1) \times N_{tot}} P(v_i)P(w_i)\log_2[P(v_i)P(w_i)] = \\ -\sum_{i=1}^{(r+1) \times N_{tot}} \left(\frac{1}{2}\right)\left(\frac{1}{2^r}\right)\log_2\left[\left(\frac{1}{2}\right)\left(\frac{1}{2^r}\right)\right] = [(r+1) \times N_{tot}]\left(\frac{1}{2}\right) = \frac{N_{tot}}{2}(r+1) \quad (Eq.\ 7)$$

Comparing the entropy $H(\{s_i\})$ in Equation 7 with $H(\{v_i\})$ in Equation 5, we can calculate bounds on the value of r to ensure $H(\{s_i\}) > H(\{v_i\})$:

$$\frac{N_{tot}}{2}(r+1) > \frac{N_{tot}}{2} \Rightarrow r > 0$$

Thus, as long as r>1, the entropy harvested from timing intervals $w_i$ is larger than that from the state detection $v_i$.

As may be realized from the above description with respect to FIG. 4, one outgrowth of the use of quantum information carriers is that due to the quantum mechanical property of the photonic (or other) carrier, the carrier should only be observed exclusively on SPAD-0 404 or SPAD-1 406. This property may be utilized to implement spurious error detection, correction or rejection in TRNGs according to embodiments.

Figure 6:
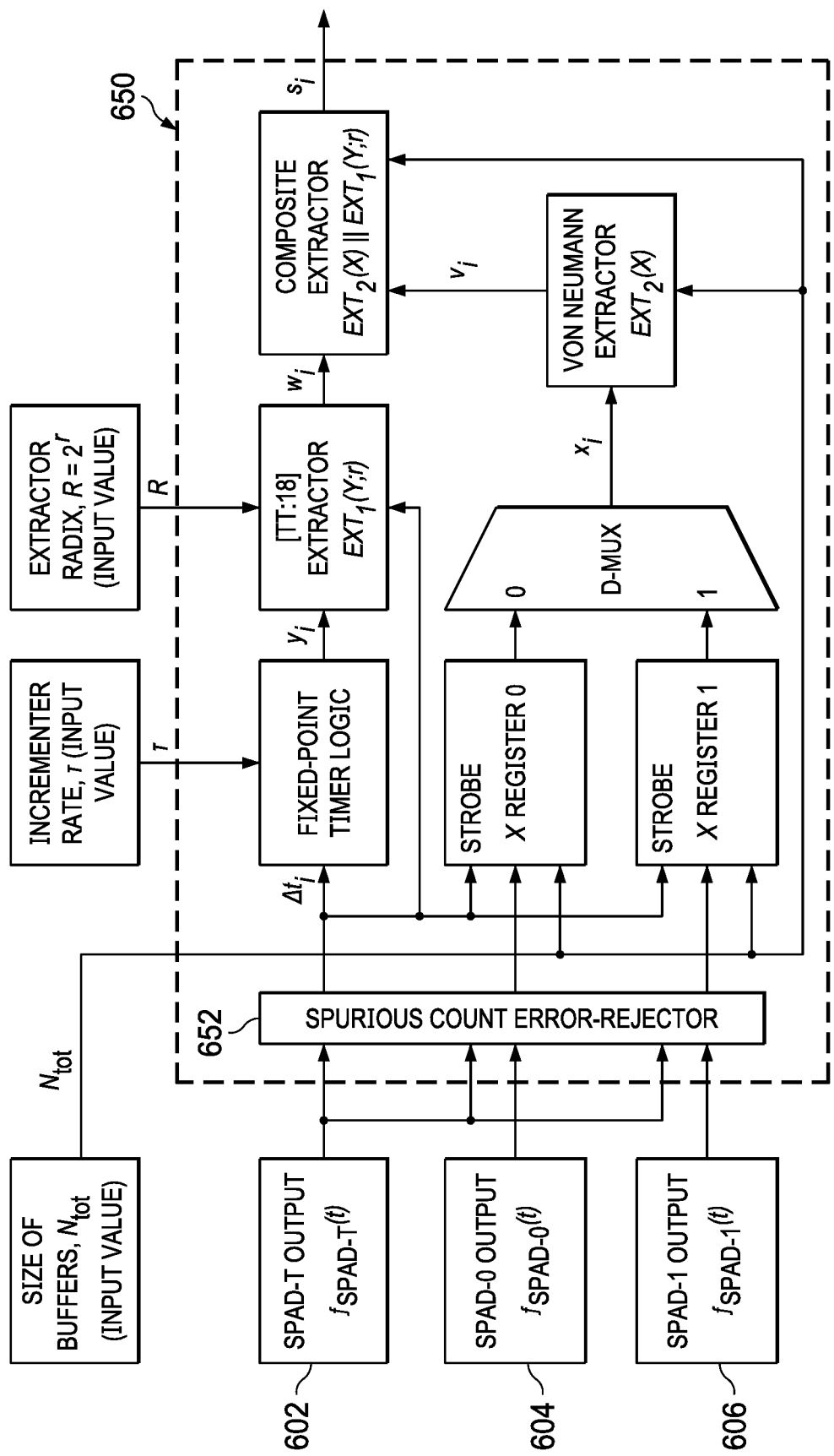
FIG. 6 is a block diagram of one embodiment of an architecture for circuit for use in a multi-source, multi-radix TRNG.

FIG. 6 depicts a block diagram of one embodiment of a circuit 650 for use in a multi-source, multi-Radix TRNG that includes spurious count error-rejection logic 672 to reject spurious detector counts from any of the SPAD outputs. The other logical blocks of circuit 650 functions substantially similarly to their counterparts as described with respect to FIG. 4 and will not be elaborated on with respect to FIG. 6. Essentially, spurious count error-rejection logic 672 takes advantage of the quantum mechanical property of the photonic (or other) information carrier in that, when a datum in superposition is observed by a detector (e.g. one of the SPAD output registers the presence of a photon), then it can only be observed in one such detector. In other words, if the SPAD-T output 602 registers a count, then exactly one of the remaining SPAD-n outputs (e.g., SPAD-0 output 604 or SPAD-1 output 606) should also register a count at the same time. Thus, if spurious count error-rejection logic 672 observe a simultaneous trigger on the SPAD-T 602 output as well as more than one of the remaining SPAD-n 604, 606 outputs, then the error-rejection logic 672 can determine that at least one of these triggers from a SPAD 602, 604, 606 was a spurious measurement. In that case, all of the simultaneously registered triggers must be discarded. There are multiple manners in which spurious count error-rejection logic 672 could work according to different embodiments. For example, one mechanism would be a simple decoder, where there is only a valid output if the number of SPAD output readings is exactly equal to 2—and further, that one of those 2 must be the SPAD-T output 602.

Spurious count error-rejection logic 672 may have other functionality as well. For example, spurious count error-rejection logic 672 may account for the source of such spurious readings. In the SPAD-based example depicted, the most likely source of such spurious readings are so-called photo-detector "dark counts", where the SPADs are triggered by incident cosmic ray particles. In order to minimize the likelihood of confusing a "dark count" caused output from a SPAD with a true quantum photonic decorrelation observation, the physical layout of the circuit 650 could be adapted to provide more information regarding the SPAD output 602, 604, 606 readings. For example, if SPAD detectors are physically far enough away from each other (or otherwise isolated by placing some sort of physical shielding between them, such as a metal trace) in the circuit 650, then the likelihood of a cosmic ray particle impinging on more than one detector at the same time may be reduced.

By shielding the detectors (e.g., the SPADs of the circuit 650) from each other in this way, such a circuit may actually decrease the likelihood of being able to determine that a particular reading was a "dark count". In contrast, if the detectors (SPADs) are placed close to one another, then such a circuit 650 can potentially record an incoming cosmic ray in more than one adjacent channel. Since the primary incoming cosmic ray particles have such high energy, it is possible that they may often cause secondary collisions, which could then also register in adjacent SPAD channels. This "clustering" of SPAD output triggers could allow spurious count error-rejection logic 672 to determine that a particular reading must have been caused by a cosmic ray.

On the other hand, if spurious count error-rejection logic 672 observe such "cluster" in one set of channels, but then also detects a simultaneous, but isolated reading at some other point in device where it can be determined that the original cosmic ray event could not have caused this isolated event, then spurious count error-rejection logic 672 may be able to "ignore" the clustered readings and also not be forced to throw out the isolated event reading. Also, in the case of such "secondary" readings, there may be a small, but potentially measurable delay between the detection events caused by the primary incoming cosmic ray and the secondary triggers. This delay could also be used to characterize these otherwise simultaneous (or nearly-simultaneous) readings. Thus, by taking onto account the physical distribution of the detectors (e.g., SPADs) in the circuit, spurious count error-rejection logic 672 could potentially glean useful information that will allow the logic to isolate dark count readings from true quantum decorrelation events.

As another potential enhancement to embodiments as discussed herein, it may be recalled from the above discussion that another potential embodiment of multi-source, multi-radix TRNGs may include more than a single pair of uncorrelated quantum sources. For example, in one embodiment of this architecture, the output signals from SPAD-0 and SPAD-1 could be replaced or supplemented by a multi-radix Hadamard structure (such as a Chrestenson gate). In this case, there could be a multiplicity of SPAD outputs (e.g. SPAD-[0, 1, m-1]), where m could potentially be much larger than 2. The same applies to a polarization-based superposition mechanism. Yet another embodiment of this architecture could utilize a frequency-coded superposition mechanism, where the incoming signal photon may be shifted to one or more of many potential output frequencies in the Hadamard (or Chrestenson) gate and subsequently separated at its output using a grating or some other frequency-selective mechanism. Any mechanism such as these just described could also be used in conjunction with the spatial and temporal entropy source measurements described herein, since they could all contain completely uncorrelated entropy information.

Figure 7:
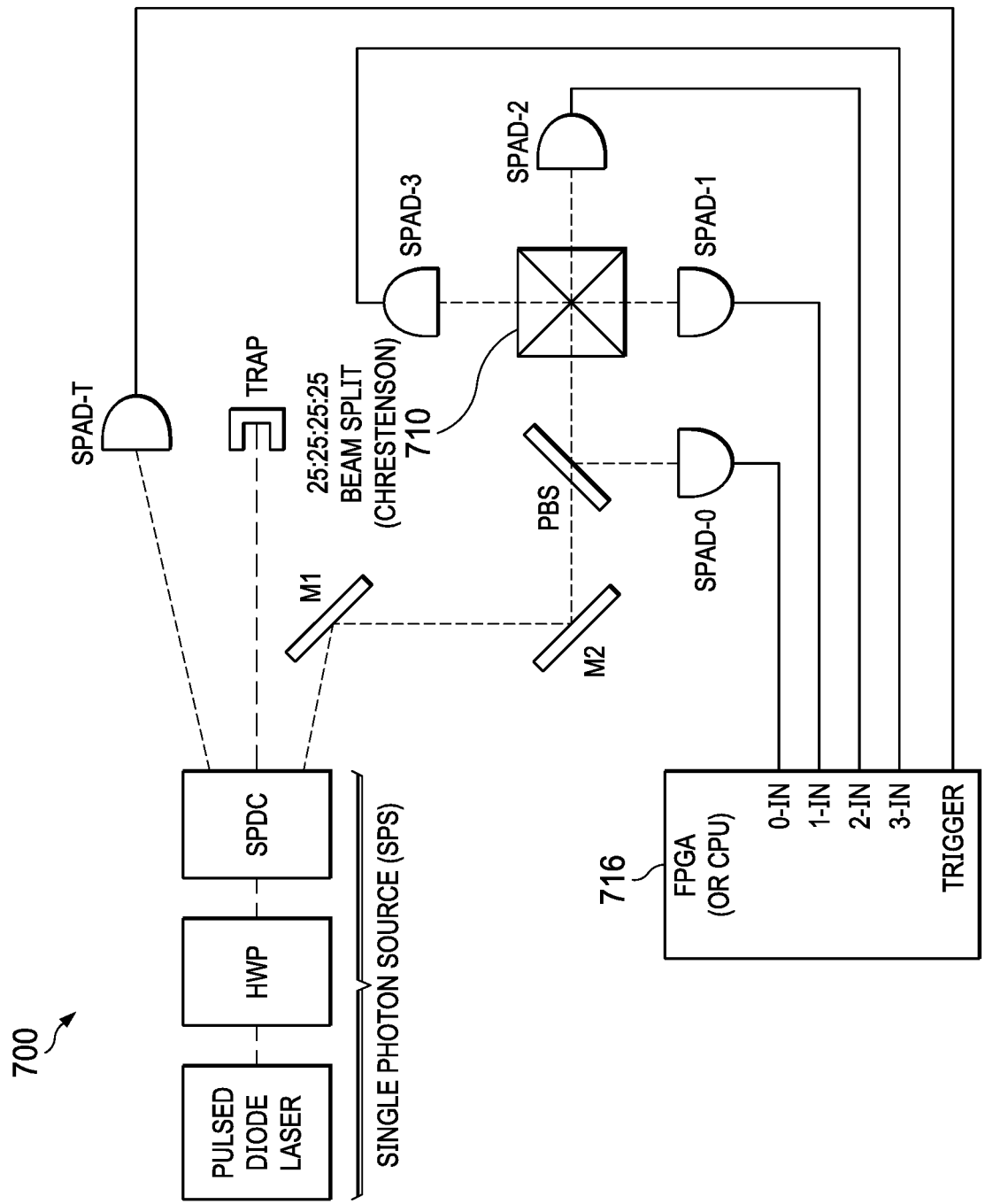
FIG. 7 is a block diagram of one embodiment of an architecture for a multi-source, multi-radix TRNG.

Turning to FIG. 7 a block diagram of another embodiment of TRNG 700 that illustrates this multi-radix Hadamard structure (in this case, a Radix-4 Chrestenson gate) is shown. This circuit utilizes the same kind of photonic information as a source of randomness as was described earlier. TRNG 700 is similar to the embodiment depicted in FIG. 3, however in TRNG 700 the Hadamard gate of FIG. 3 that results in a binary (qubit) is replaced by a radix-4 Chrestenson gate 710 (e.g., where the qubit output is now encoded in base-4). Here, the output of the Chrestenson gate 710 is provided to two additional SPADs (SPAD-2 and SPAD-3) and each of the outputs of SPAD-0, SPAD-1, SPAD-2, SPAD-3 and SPAD-T supply respective input signals (e.g., "0-in", "1-in", "2-in", "3-in", ""Trigger") to a circuit 716 (which may be realized in hardware, software or the combination of the two, such as an FPGA or processor). The circuit 716 generates an output of random values for the TRNG 700 based on the input signals received due to detection from SPAD-0, SPAD-1, SPAD-2, SPAD-3 and SPAD-T based on which detectors (SPAD-0, SPAD-1, SPAD-2, SPAD-3 or SPAD-T) were activated.

Figure 8:
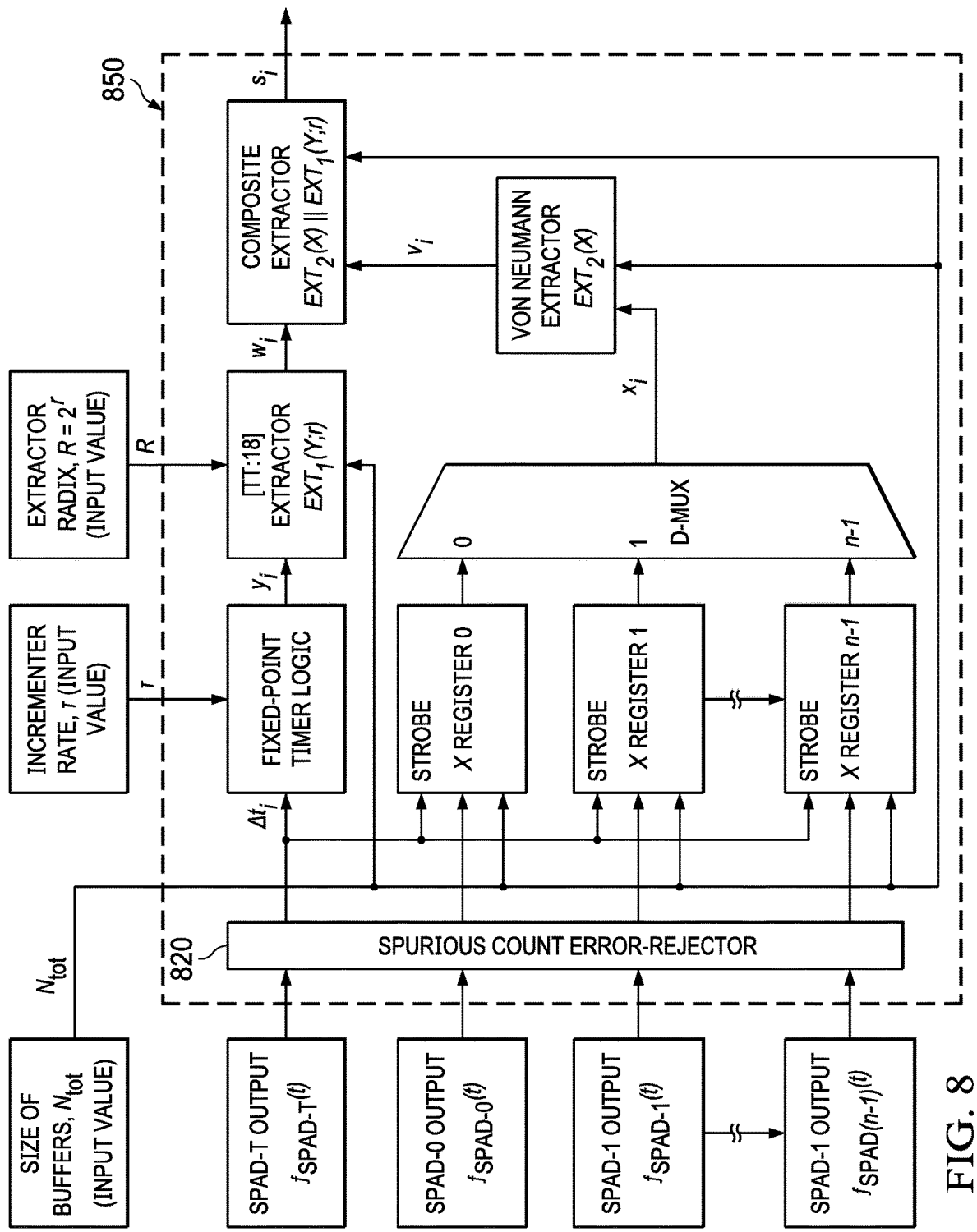
FIG. 8 is a block diagram of one embodiment of an architecture for a multi-source, multi-radix TRNG.

FIG. 8 depicts a block diagram of one embodiment of a circuit 850 for use in a multi-source, multi-Radix TRNG such as that depicted in FIG. 7. Here, it will be noted that the circuit 850 functions similarly to that of FIG. 4 where D-MUX 820 can output either a "0" or "1" electronic bit into the extractor logic circuit depending on which of SPAD-0, SPAD-1, SPAD-2 or SPAD-3 was activated. This circuit 850 could be used with a qudit of any cardinality (e.g., in the case of FIG. 8, this is extended to a qudit encoded in a radix of n-1).

While spurious error-rejection logic has been depicted in circuit 850 it will be understood that embodiments of such a circuit are contemplated either with or without such spurious error-rejection logic. As described previously, in embodiments where such logic is included, the spurious error-rejection circuitry operates in substantially the same manner; if there is a simultaneous trigger on more than 1 of the SPAD-0, SPAD-1, SPAD-2 or SPAD-3 outputs, then that reading is considered spurious and it is rejected. It will be understood that this "spurious reading rejection" logic may only apply to outputs that are due to a single datum in superposition. In other words, it may not apply to the case where multiple individual qubits are utilized, since simultaneous readings on multiple channels may occur in that case. Thus, the "rejection logic" may be implemented separately for each individual independent qubit.

However, in the case mentioned earlier, where detectors are placed near each other even though they are ostensibly intended to detect independent data, then a "dark count" event that shows up in multiple independent channels simultaneously would have a very high probability of being due to a cosmic ray event. Thus, spurious error-rejection circuitry could use this information (e.g., multiple simultaneous triggers from independent channels) to identify and "filter out" such spurious readings much more easily.

Figure 9:
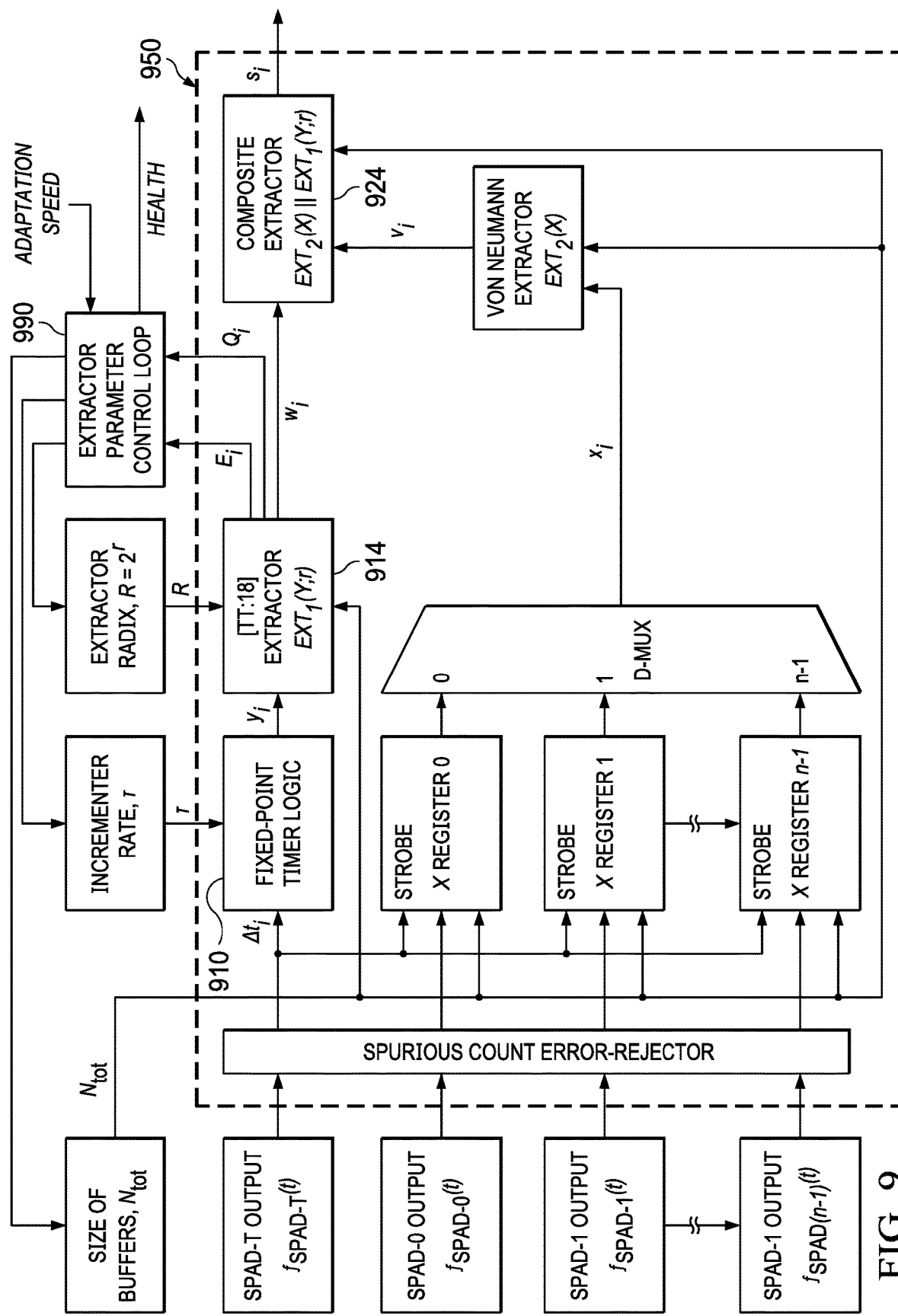
FIG. 9 is a block diagram of one embodiment of an architecture for a multi-source, multi-radix TRNG.

Yet another enhancement to embodiments of multi-source, multi-radix TRNG as disclosed herein, is the including of circuit health detection circuity that includes an extractor parameter control loop 910. FIG. 9 depicts one embodiment of circuit 950 for a TRNG that includes integrated feedback loop logic 910. This logic block 990 is designed to automatically adjust the three parameters that were previously described as being external circuit inputs, Ntot, τ and R. In this case, the output of the parameterized extractor 914 is monitored in real time using the two variables Ei and Qi.

The first of these variables (Ei) represents the number of errors accumulated per buffer, which can have multiple causes. One such error can be caused when an extractor 914 measurement falls directly on a quantile boundary. Other causes can include either under-runs or over-runs in the fixed-point timer 910 (e.g., due to an inappropriate choice of the buffer size. Other such errors could be caused by high numbers of dark count occurrences.

The second output variable (Qi) is used to monitor the quality of the parameterized extraction itself. For example, if the extractor radix is poorly matched to the buffer size (Ntot) and the timer value (τ), then the output histogram for parameterized extractor 914 can be highly uneven, which is an indication that either the TRNG is not operating efficiently or that its operating point has drifted. In the case when the TRNG (e.g., that includes the circuit 950) has just powered up, then it will most likely have powered up with a set of default values for the Ntot, τ and R parameters. If, however, these values are not well-suited to the device's operation (e.g., if there needs to be a "warm-up" period), then the control loop 990 can slowly adjust the parameters until the overall circuit is operating in its normal range.

Thus, this logic block 990 can also be used as a "health" indicator, where the output of the composite extractor may be functional, but not optimal. At that point, any external device that uses the overall extractor output (e.g., from the circuit 950) can decide whether or not to ignore the output until the circuit 950 has stabilized into a "normal" operating range. Like many such feedback-based systems, it is also highly useful to have an external control over the speed of the adaptation of the control loop. This allows the circuit to track changes in operation more quickly at power-up, for example, but to "settle in" to a more stable operational point as time progresses.

Figure 10:
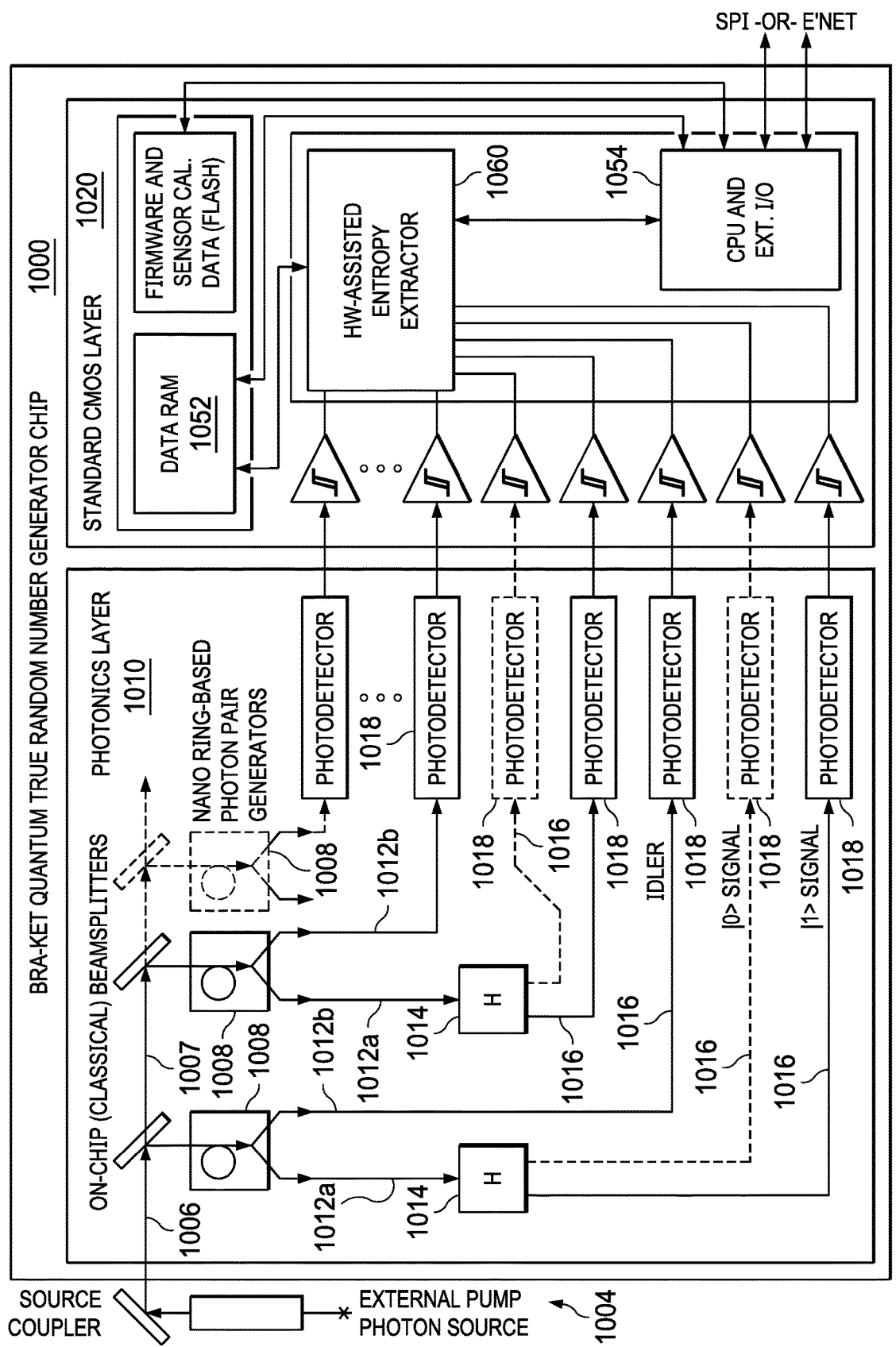
FIG. 10 is a block diagram of one embodiment of a chip including a multi-source, multi-radix TRNG.

Embodiments of TRNGs as disclosed herein may be advantageously implemented for example, using a circuit (e.g., a chip or Field Programmable Gate Array (FPGA)) whereby optical components are implemented in a photonics layer of a circuit and the integrated circuitry components, such as the entropy extractors, may be implemented on a standard Complementary Metal Oxide Semiconductor (CMOS) layer of the circuit. FIG. 10 depicts on example of an embodiment of a TRNG implemented on a chip 1000 having photonics layer 1010 and a CMOS layer 1020.

The photonics layer 1010 may be coupled to an integrated (i.e., on-chip) or an external photon source (e.g. 1004) such that photons emitted from the photon source 1004 will be routed to the photonics layer 1010 through a waveguide 1006. Waveguide 1006 may be coupled through one or more beamsplitters (1007) to one or more photon pair generators 1008 (e.g., SPDCs)s that may, for example, be nano ring-based photon pair generators. Each photon pair generator 1008 may produce a signal and trigger photon pair on two outputs 1012. One of the outputs 1012a (the signal output) may be coupled to a quantum photonic logic gate 1014 such as a Hadamard gate through a waveguide on the photonics layer 1010. Each of the outputs 1016 of the quantum photonic logic gate 1014 is coupled to a respective photodetector 1018 (e.g., SPAD-0 and SPAD-1) through a waveguide on the photonics layer 1010. The other output 1012b of the photon pair generator 1008 (the trigger output) is coupled to a photodetector 1018 (SPAD-T) through a waveguide on the photonics layer 1010. It should be noted that this same architecture could be realized in a different embodiment, using a higher-radix superposition step, such as the Chrestenson gate 710 shown in FIG. 7, without changing the overall operating concept.

The CMOS layer 1020 of the chip 1000 includes RAM 1052, a processor 1054 and other processor circuitry as may be desired in various implementations. CMOS layer 1020 also includes entropy extractor 1060 which may be implemented in hardware, software of some combination of the two. Each of the photodetectors 1018 in the photonics layer 1010 outputs an electrical signal that is coupled to the entropy extractor 1060. Entropy extractor 1060 can then generate a random value based on the inputs from the photodetectors 1018 as discussed herein. Similarly, the spurious count error detection function described earlier can also be accomplished either in dedicated hardware embedded in the HW-assisted Entropy Extractor 1060 or in software running on the CPU 1054.

Using embodiments of such an architecture then, a massive parallelization of photonics in the photonics layer 1010 may be achieved and tightly integrated with a processor (e.g., a CPU), including such integration on a single die. Embodiments may thus have the advantage of providing very small, low power, highly scalable performance that may be updatable (e.g., through software or firmware updates).

Although the invention has been described with respect to specific embodiments thereof, these embodiments are merely illustrative, and not restrictive of the invention. The description herein of illustrated embodiments of the invention, including the description in the Summary, is not intended to be exhaustive or to limit the invention to the precise forms disclosed herein (and in particular, the inclusion of any particular embodiment, feature or function within the Summary is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function, including any such embodiment feature or function described in the Summary. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Reference throughout this specification to "one embodiment", "an embodiment", or "a specific embodiment" or similar terminology means that a particular feature, structure, or characteristic described in connection with the embodiment is included in at least one embodiment and may not necessarily be present in all embodiments. Thus, respective appearances of the phrases "in one embodiment", "in an embodiment", or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application. Additionally, any signal arrows in the drawings/figures should be considered only as exemplary, and not limiting, unless otherwise specifically noted.

As used herein, the terms "comprises," "comprising," "includes," "including," "has," "having," or any other variation thereof, are intended to cover a non-exclusive inclusion. For example, a process, product, article, or apparatus that comprises a list of elements is not necessarily limited only those elements but may include other elements not expressly listed or inherent to such process, product, article, or apparatus.

Furthermore, the term "or" as used herein is generally intended to mean "and/or" unless otherwise indicated. For example, a condition A or B is satisfied by any one of the following: A is true (or present) and B is false (or not present), A is false (or not present) and B is true (or present), and both A and B are true (or present). As used herein, a term preceded by "a" or "an" (and "the" when antecedent basis is "a" or "an") includes both singular and plural of such term (i.e., that the reference "a" or "an" clearly indicates only the singular or only the plural). Also, as used in the description herein and throughout the claims that follow, the meaning of "in" includes "in" and "on" unless the context clearly dictates otherwise.

REFERENCES

The following references will be useful to an understanding of the disclosure and are fully incorporated herein by reference in their entirety for all purposes.

1. Arnoldus, H. F. and Nienhuis, G.: "Conditions for Sub-Poissonian Photon Statistics and Squeezed States in Resonance Fluorescence," Optica Acta, 30(11):1573-1585 (1983).

2. Baetoniu, C.: "Method and Apparatus for True Random Number Generation," U.S. Pat. No. 7,389,316, Jun. 17, 2008.

3. Dulz, W., Dulz, G., Hildebrandt, E., and Schmitzer, H. (inventors): "Method for Generating a Random Number on a Quantum-Mechanical Basis and Random Number Generator," U.S. Pat. No. 6,609,139, Aug. 19, 2003.

4. Dorrendorf, L., Gutterman, Z., and Pinkas, B.: "Cryptanalysis of the random number generator of the Windows operating system," ACM Transactions on Information and System Security 13(1) Article number 10, (2009).

5. Chattopadhyay, E.: "Explicit Two-source Extractors and More," Ph.D. dissertation, The University of Texas at Austin, May 2016.

6. Chattopadhyay, E. and Zuckerman, D.: "Explicit Two-source Extractors and Resilient Functions," in proc. ACM Symp. of the Theory of Computing (STOC), pp. 670-683, June 2016.

7. Fox, M.: Quantum Optics An Introduction, Oxford University Press, ISBN 13-9780-19-856673-1, 2006.

8. Huntoon, N. R., Christensen, M. P., MacFarlane, D. L., Evans, G. A., and Yeh, C. S.: "Integrated Photonic Coupler Based on Frustrated Total Internal Reflection," Applied Optics 47, 5682 (2008).

9. Hart, J. D., Terashima, Y., Uchida, A., Baumgartner, G. B., Murphy, T. E., and Roy, R.:

"Recommendations and Illustrations for the Evaluation of Photonic Random Number Generators," APL Photonics 2, 090901 (2017); https://doi.org/10.1063/1.5000056.

10. ID Quantique, S A: "Quantis Random Number Generator," http://certesnetworks.com/pdf/alliance-solutions/QNRG-When-Randomness-Can-Not-Be-Left-To-Chance.pdf, (accessed Nov. 16, 2018).

11. Jennewein, T., Achleitner, U., Weihs, G., Weinfurter, H., and Zeilinger, A.: "A Fast and Compact Quantum Random Number Generator," Review of Scientific Instruments, 71(4) 1675 (2000).

12. Koerner, B.: "Russians Engineer a Brilliant Slot Machine CheatAnd Casinos Have No Fix," Wired Magazine Feb. 6, 2017.

13. Liu, K., Huang, H., Mu, S. X., Lin, H. and MacFarlane, D. L.: "Ultra-compact three-port trench-based photonic couplers in ion-exchanged glass waveguides," Optics Communications 309, 307-312 (2013).

14. qutools GmbH: "Quantum Random Number Generator," product datasheet, http://www.qutools.com/products/quRNG/quRNG datasheet.pdf, (accessed Jun. 9, 2018), 2010.

15. Shumow, D., Ferguson, N.: "On the Possibility of a Back Door in the NIST SP800-90 Dual EC," http://rump2007.cr.yp.to/15-shumow.pdf.

16. Stipcevic, M.: "QBG121 Quantum Random Number Generator, Datasheet, v. 20060328," http://www.irb.hr/users/stipcevi/index.html, (accessed Jun. 9, 2018).

17. Sultana, N., Zhou, W., LaFave Jr., T. P., and MacFarlane, D. L.: "HBr Based ICP Etching of High Aspect Ratio Nanoscale Trenches in InP: Considerations for Photonic Applications," J. Vac. Sci. Technol., B 27, 2351 (2009).

18. Thornton, M. A. and Thornton, M. A.: "Multiple-valued Random Digit Extraction," in proc. IEEE Int. Symp. on Multiple-Valued Logic (ISMVL), pp. 162-167, May 2018.

19. Zou, X. and Mandel, L.: "Photon-antibunching and sub-Poissonian Photon Statistics," Physical Review A, 41(1):475-476.

20. Zhou, W., Sultana, N., and MacFarlane, D. L.: "HBr-Based Inductively Coupled Plasma Etching of High Aspect Ratio Nanoscale Trenches in GaInAsP/InP," J. Vac. Sci. Technol., B 26, 1896 (2008).

21. Thornton, M. A., Randomness Properties of Cryptographic Hash Functions, M.S.C.p.E. thesis, Dept. of Computer Science and Engineering, Southern Methodist University, December 2017.

What is claimed is:

1. A system for a quantum photonic true random number generator, comprising:
  a photon source adapted to generate a signal photon and an idler photon;
  a trigger single photon avalanche diode (SPAD-T) adapted to detect the idler photon and generate a trigger output when the idler photon is detected;
  a quantum logic gate adapted to receive the signal photon and generate a superposition of the signal photon on a first output of the quantum logic gate and a second output of the quantum logic gate;
  a first SPAD (SPAD-0) coupled to the first output of the quantum logic gate and adapted to detect the signal photon and generate an output of SPAD-0 when the signal photon is detected at the first output of the quantum logic gate;
  a second SPAD (SPAD-1) coupled to the second output of the quantum logic gate and adapted to detect the signal photon and generate an output of SPAD-1 when the signal photon is detected at the second output of the quantum logic gate;
  logic coupled to the trigger output, the output of SPAD-0 and the output of SPAD-1, the logic including:
    a first extractor adapted to extract a set of first random values based on the trigger output, wherein the extractor is a multi-radix extractor;
    a second extractor adapted to extract a set of second random values based on the output of SPAD-0 and the output of SPAD-1; and
    a composite extractor adapted to extract a third set of random values by compositing the set of first random values and the set of second random values and provide the third set of random values as the output of the quantum photonic true random number generator.

2. The system of claim 1, wherein the quantum logic gate is a Hadamard gate.

3. The system of claim 2, wherein the second extractor is a binary radix extractor.

4. The system of claim 3, wherein the second extractor is a von Neumann extractor.

5. The system of claim 1, wherein the quantum logic gate is a higher-radix quantum logic gate, generating a superposition of the signal photon on the first output, the second output, a third output or a fourth output of the quantum logic gate, and the system comprises a third SPAD (SPAD-2) coupled to the third output of the quantum logic gate and adapted to detect the signal photon and generate an output of SPAD-2 when the signal photon is detected and a fourth SPAD (SPAD-3) coupled to the fourth output of the quantum logic gate, and adapted to detect the signal photon and generate an output of SPAD-3 when the signal photon is detected, and wherein the logic is coupled to the output of SPAD-2 and the output of SPAD-3 and the second extractor generates the set of second random values based on the output of SPAD-2 and SPAD-3.

6. The system of claim 5, wherein the second extractor is a multi-radix extractor.

7. The system of claim 1, further comprising spurious count error-rejection logic adapted to reject a spurious detector count from any of the SPAD outputs based on the output of SPAD-0 and SPAD-1.

8. A method for generating a true random number, comprising:
  generate a signal photon and an idler photon at a photon source;
  detecting the idler photon and generating a trigger output when the idler photon is detected;
  receiving the signal photon and generating a superposition of the signal photon on a first output and a second output of a quantum function;
  when the signal photon is detected on one of the first output, generating a first detector output;
  when the signal photon is detected on the second output, generating a second detector output;
  extracting a set of first random values based on the trigger output using a multi-radix extractor;
  extracting a set of second random values based on the first detector output and the second detector output;
  extracting a third set of random values by compositing the set of first random values and the set of second random values; and
  providing the third set of random values as a true random number.

9. The method of claim 8, wherein the signal photon is placed into superposition with non-equal probabilities on the first output and the second output by of the quantum function.

10. The method of claim 9, wherein the set of second random values are extracted by a binary radix extractor.

11. The method of claim 10, wherein the binary extractor is a von Neumann extractor.

12. The method of claim 8, wherein the signal photon is detected on the first output, the second output, a third output or a fourth output by of the quantum function and the method further comprises:
  when the signal photon is detected on the third output, generating a third detector output;
  when the signal photon is detected on the fourth output, generating a fourth detector output, wherein the set of second random values is based on the third detector output and the fourth detector output.

13. The method of claim 12, wherein the set of second random values are extracted by a multi-radix extractor.

14. The method of claim 8, further comprising rejecting a spurious detector count from any of the detector outputs based on the first detector output and the second detector output.

* * * * *